US005726650A

United States Patent [19]

Yeoh et al.

[11] Patent Number: 5,726,650
[45] Date of Patent: Mar. 10, 1998

[54] ADAPTIVE MANCHESTER DECODING WITH ADJUSTABLE DELAY AND POWER SAVING MODE

[75] Inventors: Charles W. K. Yeoh; Bambang Gunadi; Hiok Nam Tay, all of Singapore, Singapore

[73] Assignee: Silicon Systems, Inc., Tustin, Calif.

[21] Appl. No.: 479,613

[22] Filed: Jun. 7, 1995

[51] Int. Cl.⁶ .................................................. H03M 5/12
[52] U.S. Cl. ........................... 341/70; 375/333; 375/360; 375/361; 455/343
[58] Field of Search .................... 341/70; 375/327, 375/333, 360, 361; 455/343

[56] References Cited

U.S. PATENT DOCUMENTS

| 4,984,255 | 1/1991 | Davis et al. | 375/360 |
| 5,003,562 | 3/1991 | Van Driest et al. | 375/327 |
| 5,023,891 | 6/1991 | Johnson, III | 341/70 |
| 5,109,530 | 4/1992 | Stengel | 455/38.3 |
| 5,404,544 | 4/1995 | Crayford | 395/750 |
| 5,422,807 | 6/1995 | Mitra et al. | 364/184 |

Primary Examiner—Jeffrey A. Gaffin
Assistant Examiner—Thliy-Trang N. Huynh
Attorney, Agent, or Firm—Hecker & Harriman

[57] ABSTRACT

A method and apparatus for recovering clock and data signals from a Manchester code is provided. The present invention uses a phase lock loop with a digital delay line wherein an adjustable delay is introduced into the Manchester coded signal for synchronizing the coded signal with the local clock of the decoding apparatus. This delaying technique enables the present invention to successfully receive Manchester coded signals having substantial jitter. The present invention also conserves energy by reducing power consumption when no signals are present.

20 Claims, 22 Drawing Sheets

ADAPTIVE MANCHESTER DECODING WITH ADJUSTABLE DELAY AND POWER SAVING MODE

BACKGROUND OF THE INVENTION

1. Field of the Invention

The present invention relates to recovery of the clock and data of a Manchester code.

2. Background Art

Manchester coding is a technique for representing data to facilitate its transmission over communication media. Manchester coding provides a binary signal that is DC-balanced and that provides self-clocking. A DC-balanced signal has voltage levels of which the average over time is constant and is an equal voltage away from the voltages of the binary levels regardless of the data being transmitted. Self-clocking signals inherently provide timing information along with data. Because of these advantages, Manchester coding is commonly used for data communication. However, to interpret Manchester coded signals, a technique is needed to recover the encoded data.

Many techniques for Manchester code recovery exist. Analog phase lock loops (PLL's) were among the earliest techniques used. Digital techniques have subsequently been developed. The digital techniques can be classified under three broad categories.

In the first category are phase lock loops with digital delay lines. An example of this type of Manchester decoder may be found in U.S. Pat. No. 5,003,562, issued to van Driest, et al. on Mar. 26, 1991. The technique disclosed in this patent uses a programmable delay line to adjust its internal 10 MHz clock to synchronize with the Manchester code. The delay line must be capable of generating a minimum of 100 nanoseconds of delay. These requirements result in a decoder that is large and consumes substantial power.

In the second category is input transition triggering using a delay line. Techniques that fall under this category are prone to double jitter errors for double one or double zero reception.

In the third category is high frequency clock sampling. Techniques in this category require high clock frequency (typically eight to ten times the frequency of the data signal being transmitted) that is often not practical to generate internally in an integrated circuit (IC). Such techniques also consume substantial power and the resolution is not good enough for recovery for the Manchester code exhibits excessive jitter.

Thus, although Manchester coding is popular, techniques for Manchester code recovery have typically required substantial amounts of power, have been limited in the amount of jitter that may be present on a signal or have required excessive clock frequencies.

SUMMARY OF THE INVENTION

The present invention provides a method and apparatus for recovering clock and data signals from a Manchester code. The present invention uses a phase lock loop with a digital delay line. The present invention successfully receives Manchester coded signals having substantial jitter. The present invention also conserves energy by reducing power consumption when no signals are present or if the receive data does not have an address match.

The present invention provides for power consumption control by removing the clock signals from circuit blocks when no Manchester coded signals are present. The present invention introduces delay to compensate for jitter in Manchester coded signals. The present invention tracks the timing of the signals to determine the amount of delay to be introduced, then causes the appropriate delay to be applied.

In the preferred embodiment of the present invention, SLEEP and WAKEUP_signals are provided to control the state of the powerup/powerdown circuitry. When the SLEEP signal is asserted, the clock signals are removed from circuit blocks involved in the reception of Manchester coded signals, effectively reducing power consumption of these blocks. When the SLEEP signal is reset to its inactive state or the WAKEUP_signal is asserted, the clock signals are restored, returning the circuit blocks to a fully operational mode.

Furthermore, the preferred embodiment of the present invention provides a delay block having three counters for providing delays. The delays are applied to Manchester coded signals to compensate for jitter and other timing irregularities.

The present invention provides Manchester decoding that is resistant to a broader range of jitter than the prior art and that consumes less power than the prior art. Thus, the disadvantages of the prior art have been overcome.

BRIEF DESCRIPTION OF THE DRAWINGS

FIG. 1(A) is a timing diagram illustrating an ideal Manchester coded signal.

FIG. 1(B) is a timing diagram illustrating a Manchester coded signal with jitter.

FIG. 1(C) is a timing diagram illustrating a Manchester coded signal with jitter.

FIG. 1(D) is a timing diagram illustrating a Manchester coded signal with jitter.

FIG. 1(E) is a timing diagram illustrating a Manchester coded signal with jitter.

FIGS. 3-1 and 3-2 are a schematic diagram illustrating STRTCTRL block 201 of the preferred embodiment of the present invention.

FIGS. 4-1 and 4-2 a schematic diagram illustrating DLY_UNIT block 202 of the preferred embodiment of the present invention.

FIGS. 5-1, 5-2 and 5-3 are a schematic diagram illustrating TTDLOGIC block 203 of the preferred embodiment of the present invention.

FIGS. 13-1, 13-2, 13-3 and 13-4 are a schematic diagram illustrating an embodiment of data logic block 530 of FIG. 5.

FIG. 14-1 and 14-2 are a schematic diagram illustrating an embodiment of edge logic block 1350 of FIG. 13.

DETAILED DESCRIPTION OF THE INVENTION

Figure 1:
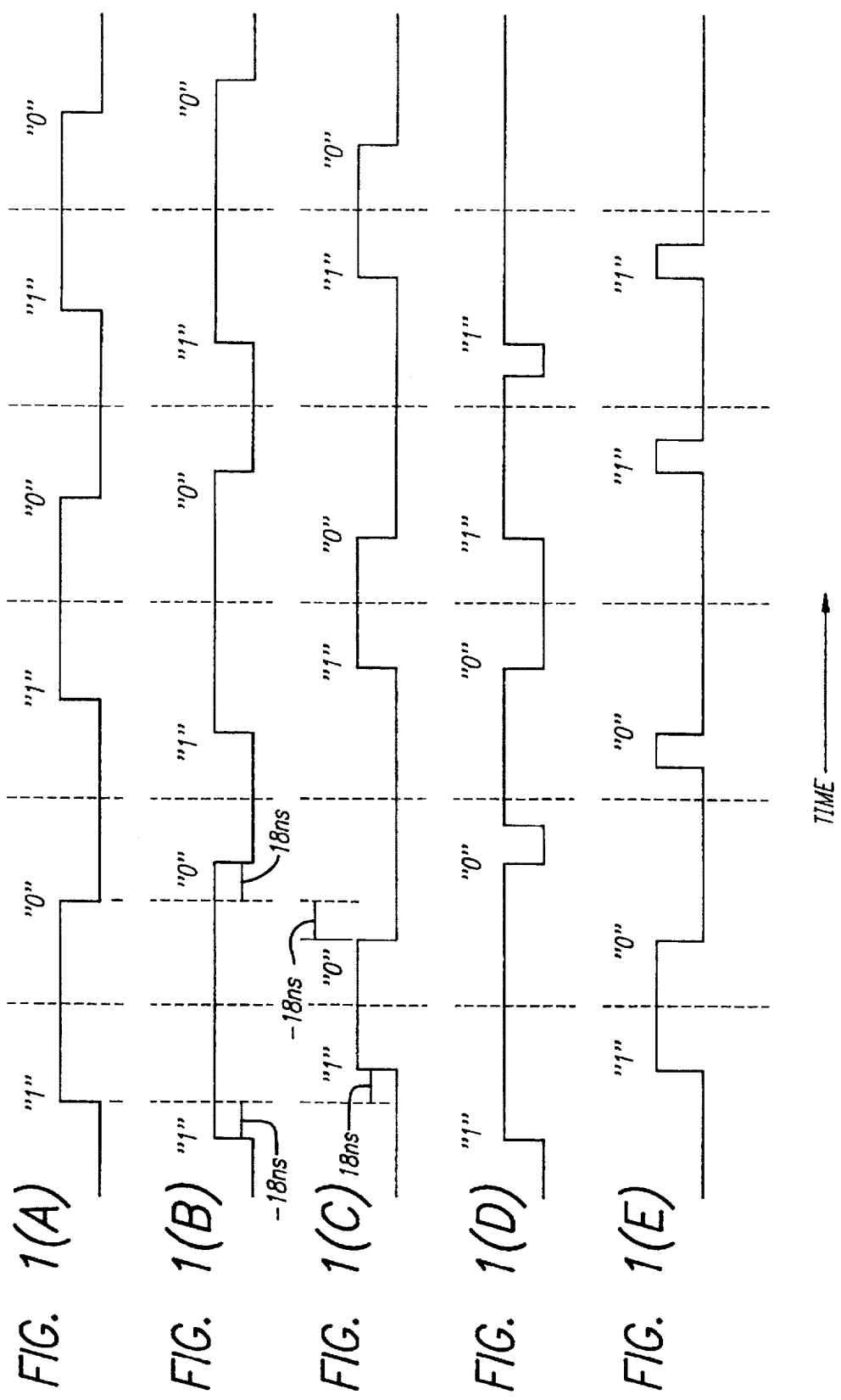

A method and apparatus to recover clock and data from a Manchester coded signal is described. In the following description, numerous specific details are set forth in order to provide a more thorough understanding of the present invention. It will be apparent, however, to one skilled in the art, that the present invention may be practiced without these specific details. In other instances, well-known features have not been described in detail in order not to unnecessarily obscure the present invention.

Communication of information may occur over various types of media, for example, metallic conductors, radio waves, optical fibers, etc. While some types of media allow several channels of information to be passed, allowing the information and, optionally, characteristics about the information to be sent over a number of channels so as to simplify the transmission and reception processes, other media offer only single channel capacity or provide only a single channel for handling particular information. When only a single channel is available for the information, it is typically necessary to encode the information for transmission and to decode the information for reception. Different coding schemes have been used, including NRZ (nonreturn to zero), RZ (return to zero), and Manchester coding.

Manchester coding uses a level transition to represent a data bit. A positive-going transition represents a binary zero, and a negative-going transition represents a binary one. Thus, a transition is guaranteed for every data bit. By reliably providing periodic transitions at every cycle, Manchester coding is self-clocking, i.e., a clock signal for the information being communicated can be derived from the information itself. Thus, the need for a separate channel to communicate clocking information is avoided.

Although Manchester decoders have been available in the past, they often draw excessive power, even if no signal is being received. Thus, there is a need for a Manchester decoder with a power saving feature. Furthermore, some jitter or distortion of the signal may occur. Although prior art Manchester decoders have been able to handle minor jitter, a method is needed to handle greater jitter, such as jitter that exceeds ±18 nanoseconds.

FIG. 1(A) is a timing diagram illustrating an ideal Manchester coded signal. In a Manchester code, the first half of a "1" data bit is at a low level, then a transition from the low level to a high level occurs at the mid bit, with the second half of the "1" data bit having a high level. A "0" data bit has the opposite levels and transition. The first half of a "0" data bit is at a high level, then a transition from the high level to a low level occurs at the mid bit, with the second half of the "0" data bit having a low level. Thus, the data pattern represented in FIG. 1(A) is, from left to right, "101010". In an ideal Manchester coded signal, the transitions are well balanced and exhibit no jitter. In practical situations, however, jitters cause the transitions to be skewed, complicating the task of recovering data from the Manchester code.

FIG. 1(B) is a timing diagram illustrating a Manchester coded signal with jitter. The signal represent the data pattern "101010" (from left to right). The rising edges, which represent "1" data bits, occur 18 nanoseconds before they should, while the falling edges, which represent "0" data bits, occur 18 nanoseconds after they should. This phenomenon results in loss of DC balance since the average voltage is higher than it should be. The self-clocking ability is also impaired since the transitions lack the periodicity and the relationship to the data clock rate of the ideal signal.

FIG. 1(C) is a timing diagram illustrating a Manchester coded signal with jitter. The signal represents the data pattern "101010" (from left to right). The rising edges, which represent "1" data bits, occur 18 nanoseconds after they should, while the falling edges, which represent "0" data bits, occur 18 nanoseconds before they should. As in the previous figure, DC balance is lost. In this case, the average voltage is lower than it should be. The self-clocking ability is also impaired since the transitions lack the periodicity and the relationship to the data clock rate of the ideal signal.

FIG. 1(D) is a timing diagram illustrating a Manchester coded signal with jitter. The signal represents the data pattern "10011" (from left to right). The rising edges, which represent "1" data bits, occur early, while the faring edges, which represent "0" data bits, occur late. Thus, DC balance is lost, self-clocking is impaired, and recovery is more problematic.

FIG. 1(E) is a timing diagram illustrating a Manchester coded signal with jitter. The signal represents the data pattern "10011" (from left to right). The rising edges, which represent "1" data bits, occur late, while the falling edges, which represent "0" data bits, occur early. Thus, DC balance is lost, self-clocking is impaired, and recovery is more problematic.

Traditional phase lock loop techniques use clock recovery to lock on to a Manchester code. These traditional techniques are limited in their jitter compensation capabilities. The present invention uses a fixed clock and achieves locking by controlling the delay of the Manchester code. The present invention provides greater jitter compensation than traditional techniques. Furthermore, the present invention allows a decoder to be placed in a power saving mode when no signals are being received.

IEEE Standard 802.3 specifies a worst case jitter of ±18 nanoseconds. Therefore, a Manchester decoder must be able to handle ±18 nanoseconds jitter to comply with IEEE Standard 802.3. The present invention can accommodate jitter beyond ±18 nanoseconds. Thus, the present invention may be used to provide a Manchester decoder that exceeds IEEE Standard 802.3.

American National Standards Institute (ANSI)/Institute of Electrical and Electronics Engineers (IEEE) Standard 802.3 (ANSI/IEEE Std. 802.3), which is also known as International Organization for Standardization (ISO)/International Electrotechnical Commission (IEC) 8802-3 (International Standard ISO/IEC 8802-3), specifies a data packet of 8 bytes of preamble, 6 bytes of destination address, 6 bytes of source address, 2 bytes of length information, and 46 to 1500 bytes of data. Data transmitted over a network passes through the transmission medium of the network. The transmission medium may be a relatively thick coaxial cable, a relatively thin coaxial cable, a twisted pair of metallic conductors, a fiber optic cable, or any suitable electromagnetic or other medium.

A network transceiver receives signals from the transmission medium and provides a received signal to an attachment unit interface (AUI). The AUI is coupled to a Manchester encoder/decoder (endec). The endec decodes Manchester encoded data received from the network and also encodes data to be transmitted over the network using Manchester encoding. Data recovered by a Manchester decoder is directed to another circuit called a data link controller. In the present invention, the data link controller checks to determine if the address of the received packet matches the address programmed in the data link controller. If the address of the received packet does not match the address programmed in the data link controller, the data link controller of the present invention asserts a sleep signal to the Manchester decoder. The sleep signal of the present invention stop the internal clocks and block further data from entering the Manchester decoder, thereby reducing power consumption.

Figure 2:
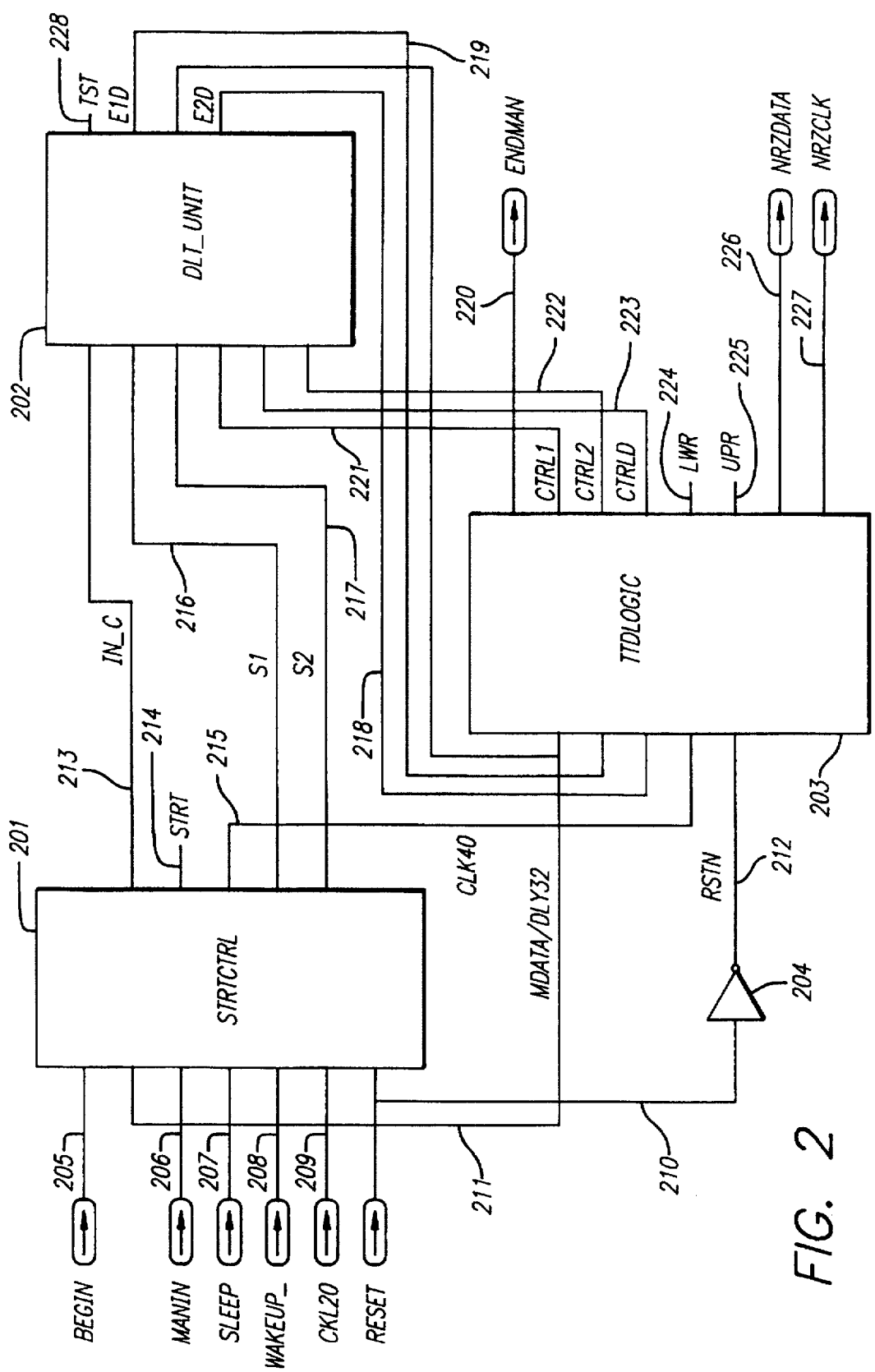
FIG. 2 is a block diagram illustrating the Manchester decoder of the present invention.

FIG. 2 is a block diagram illustrating the Manchester decoder of the present invention. The decoder includes STRTCTRL block 201, DLY_UNIT block 202, TTDLOGIC block 203, inverter 204, BEGIN input, MANIN input, SLEEP input, WAKEUP_input, CLK20 input, RESET input, STRT output, TST output, ENDMAN output, NRZDATA output, NRZCLK output, and nodes 205–228.

The BEGIN input is provided by a network transceiver circuit. The network transceiver circuit asserts the BEGIN input when it detects the presence of a signal in the transmission medium and deasserts the BEGIN input when it detects the absence of a signal in the transmission medium. The BEGIN input is coupled through node 205 to STRTCTRL block 201. The MANIN input is coupled through node 206 to STRTCTRL block 201. The SLEEP input is coupled through node 207 to STRTCTRL block 201. The WAKEUP_ input is coupled through node 208 to STRTCTRL block 201. The CLK20 input is coupled through node 209 to STRTCTRL block 201. The RESET input is coupled through node 210 to STRTCTRL block 201 and to an input of inverter 204. Signal MDATA/DLY32 from DLY_UNIT block 202 is coupled via node 211 to STRTCTRL block 201 and to TTDLOGIC block 203. The output of inverter 204 provides signal RSTN through node 212 to TTDLOGIC block 203.

STRTCTRL block 201 provides signal IN_C via node 213 to DLY_UNIT block 202. STRTCTRL block 201 provides signal STRT at node 214. STRTCTRL block 201 provides signal CLK40 via node 215 to TTDLOGIC block 203. STRTCTRL block 201 provides signal S1 via node 216 to DLY_UNIT block 202. STRTCTRL block 201 provides signal S2 via node 217 to DLY_UNIT block 202. DLY_ UNIT block 202 provides signal E2D via node 218 to TTDLOGIC block 203. DLY_UNIT block 202 provides signal E1D via node 219 to TTDLOGIC block 203.

TTDLOGIC block 203 provides output ENDMAN at node 220. TTDLOGIC block 203 provides 6-bit signal CTRL1 via node 221 to DLY_UNIT block 202. TTDLOGIC block 203 provides 6-bit signal CTRL2 via node 222 to DLY_UNIT block 202. TTDLOGIC block 203 provides 6-bit signal CTRLD via node 223 to DLY_UNIT block 202. TTDLOGIC block 203 provides output LWR at node 224 and output UPR at node 225. TTDLOGIC block 203 provides output NRZDATA at node 226 and NRZCLK at node 227. DLY_UNIT 202 provides output TST at node 228.

The Manchester decoder of the present invention comprises STRTCTRL block 201, DLY_UNIT block 202, and TTDLOGIC block 203. STRTCTRL block 201 responds to SLEEP and WAKEUP_signals to control the powerup/ powerdown operation of the other blocks. DLY_UNIT block 202 delays the Manchester code signals so as to compensate for jitter and other irregularities in the timing of the signals. TTDLOGIC block 203 tracks the timing of the Manchester code signals and controls the amount of compensation applied to the signals.

Figure 3A:
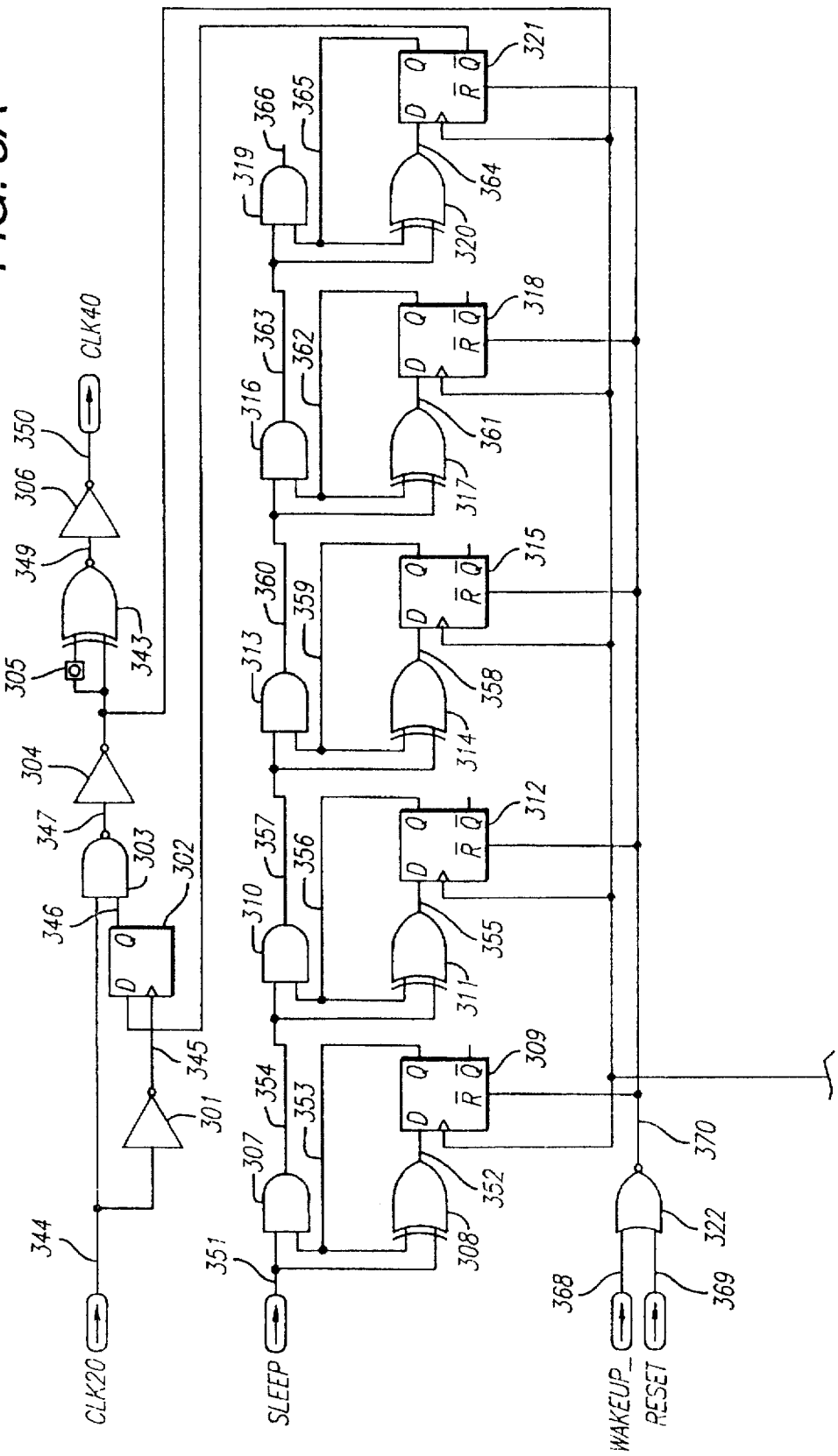
Figure 3B:
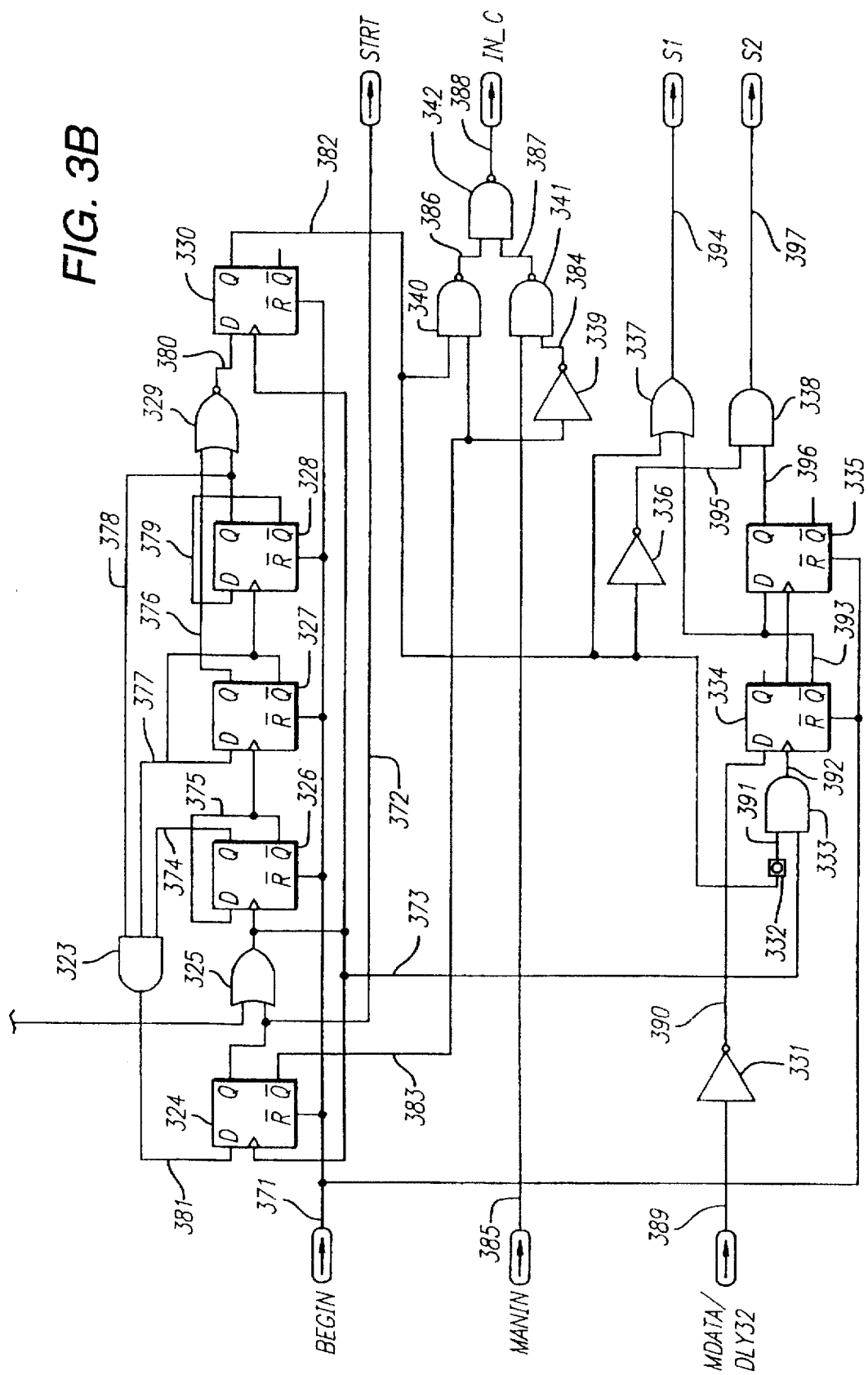

FIGS. 3-1 and 3-2 are a schematic diagram illustrating STRTCTRL block 201 of the preferred embodiment of the present invention. STRTCTRL block 201 includes inverter 301, D flip-flop 302, NAND gate 303, inverter 304, delay circuit 305, exclusive NOR (XNOR) gate 343, inverter 306, AND gate 307, exclusive OR (XOR) gate 308, resettable D flip-flop 309, AND gate 310, exclusive OR (XOR) gate 311, resettable D flip-flop 312, AND gate 313, exclusive OR (XOR) gate 314, resettable D flip-flop 315, AND gate 316, exclusive OR (XOR) gate 317, resettable D flip-flop 318, AND gate 319, exclusive OR (XOR) gate 320, resettable D flip-flop 321, NOR gate 322, AND gate 323, resettable D flip-flop 324, OR gate 325, resettable D flip-flop 326, resettable D flip-flop 327, resettable D flip-flop 328, NOR gate 329, resettable D flip-flop 330, inverter 331, delay circuit 332, AND gate 333, resettable D flip-flop 334, resettable D flip-flop 335, inverter 336, OR gate 337, AND gate 338, inverter 339, NAND gate 340, NAND gate 341, and NAND gate 342.

Input CLK20 is coupled via node 344 to an input of inverter 301 and to an input of NAND gate 303. The output of inverter 301 is coupled via node 345 to the clock input of D flip-flop 302. The Q output of D flip-flop is coupled via node 346 to an input of NAND gate 303. The output of NAND gate 303 is coupled via node 347 to an input of inverter 304. The output of inverter 304 is coupled via node 348 to an input of delay circuit 305, to an input of XNOR gate 343, to the clock input of each of resettable D flip-flops 309, 312, 315, 318, 321, and to an input of OR gate 325. The output of XNOR gate 343 is coupled via node 349 to an input of inverter 306. The output of inverter 306 is coupled via node 350 to output CLK40.

Input CLK20 is a clock input, preferably having a frequency of 20 MHz. Input CLK20 may be derived from a crystal oscillator or a clock generator circuit. Delay circuit 305 and XNOR gate 343 provide a signal having twice the frequency of input CLK20.

Input SLEEP is coupled via node 351 to an input of AND gate 307 and to an input of XOR gate 308. The output of XOR gate 308 is coupled via node 352 to the D input of resettable D flip-flop 309. The Q output of resettable D flip-flop is coupled via node 353 to an input of AND gate 307 and to an input of XOR gate 308. The output of AND gate 307 is coupled through node 354 to an input of AND gate 310 and to an input of XOR gate 311. The output of XOR gate 311 is coupled through node 355 to the D input of resettable D flip-flop 312. The Q output of resettable D flip-flop 312 is coupled via node 355 to an input of AND gate 310 and to an input of XOR gate 311.

The output of AND gate 310 is coupled via node 357 to an input of AND gate 313 and to an input of XOR gate 314. The output of XOR gate 314 is coupled via node 358 to the D input of resettable D tip-flop 315. The Q output of resettable D flip-flop 315 is coupled via node 359 to an input of AND gate 313 and to an input of XOR gate 314.

The output of AND gate 313 is coupled via node 360 to an input of AND gate 316 and to an input of XOR gate 317. The output of XOR gate 317 is coupled via node 361 to the D input of resettable D tip-flop 318. The Q output of resettable D flip-flop 318 is coupled via node 362 to an input of AND gate 316 and to an input of XOR gate 317.

The output of AND gate 316 is coupled via node 363 to an input of AND gate 319 and to an input of XOR gate 320. The output of XOR gate 320 is coupled via node 364 to the D input of resettable D flip-flop 321. The Q output of resettable D flip-flop 321 is coupled via node 365 to an input of AND gate 319 and to an input of XOR gate 320. The output of AND gate 319 is coupled to node 366. The $\overline{Q}$ output of resettable D flip-flop 321 is coupled via node 367 to the D input of D flip-flop 302.

Input WAKEUP_ is coupled via node 368 to an input of NOR gate 322. Input RESET is coupled via node 369 to an input of NOR gate 322. The output of NOR gate 322 is coupled via node 370 to the $\overline{R}$ (reset) input of each of resettable D flip-flops 309, 312, 315, 318, and 321.

Input BEGIN is coupled via node 371 to the $\overline{R}$ (reset) input of each of resettable D flip-flops 324, 326, 327, 328, 330, 334, and 335. The Q output of resettable D flip-flop 324 is coupled through node 372 to an input of OR gate 325 and to output STRT. The output of OR gate 325 is coupled through node 373 to an input of AND gate 333 and to the clock input of each of resettable D flip-flops 324, 326, and 330. The Q output of resettable D flip-flop 326 is coupled through node 374 to an input of AND gate 323. The $\overline{Q}$ output of resettable D flip-flop 326 is coupled through node 375 to the D input of resettable D flip-flop 326 and to the clock input of resettable D flip-flop 327. The Q output of resettable D flip-flop 327 is coupled to an input of NOR gate 329. The $\overline{Q}$ output of resettable D flip-flop 327 is coupled through node 377 to the D input of resettable D flip-flop 327, to the clock input of resettable D flip-flop 328 and to an input of AND gate 323. The Q output of resettable D flip-flop 328 is coupled through node 378 to an input of NOR gate 329 and to an input of AND gate 323. The $\overline{Q}$ input of resettable D flip-flop 328 is coupled though node 379 to the D input of resettable D flip-flop 328. The output of NOR gate 329 is coupled through node 380 to the D input of resettable D flip-flop 330. The output of AND gate 323 is coupled through node 381 to the D input of resettable D flip-flop 324. The Q output of resettable D flip-flop 330 is coupled through node 382 to an input of AND gate 340, to an input of OR gate 337, to an input of inverter 336, and to an input of delay circuit 332.

The $\overline{Q}$ output of resettable D flip-flop 324 is coupled through node 383 to an input of NAND gate 340 and to an input of inverter 339. The output of inverter 339 is coupled through node 384 to an input of NAND gate 341. Input MANIN is coupled through node 385 to an input of NAND gate 341. The output of NAND gate 340 is coupled through node 386 to an input of NAND gate 342. The output of NAND gate 341 is coupled through node 387 to an input of NAND gate 342. The output of NAND gate 342 is coupled through node 388 to output IN_C.

Input MDATA/DLY32 is coupled through node 389 to an input of inverter 331. The output of inverter 331 is coupled through node 390 to the D input of resettable D flip-flop 334. The output of delay circuit 332 is coupled through node 391 to an input of AND gate 333. The output of AND gate 333 is coupled through node 392 to the clock input of resettable D flip-flop 334. The $\overline{Q}$ output of resettable D flip-flop 334 is coupled through node 393 to the D input of resettable D flip-flop 335 and to an input of OR gate 337. The output of OR gate 337 is coupled through node 394 to output S1. The output of inverter 396 is coupled through node 395 to an input of AND gate 338. The Q output of resettable D flip-flop 335 is coupled through node 396 to an input of AND gate 338. The output of AND gate 338 is coupled through node 397 to output S2.

In STRTCTRL block 201, inputs SLEEP and WAKEUP_ are used to provide a power saving feature by controlling the sleep and wake up modes. When an incoming Manchester code is detected, the circuit in this block puts out a 100 nanoseconds pulse to the delay unit, which is illustrated as DLY_UNIT block 202. It then monitors the return of this pulse and selects the delay cell configuration. This technique enables optimum delay cell adjustments over process variations (in ICs), voltage and temperature. After the calibration and selection of the delay cell the Manchester code is allowed into the delay unit.

Figure 4A:
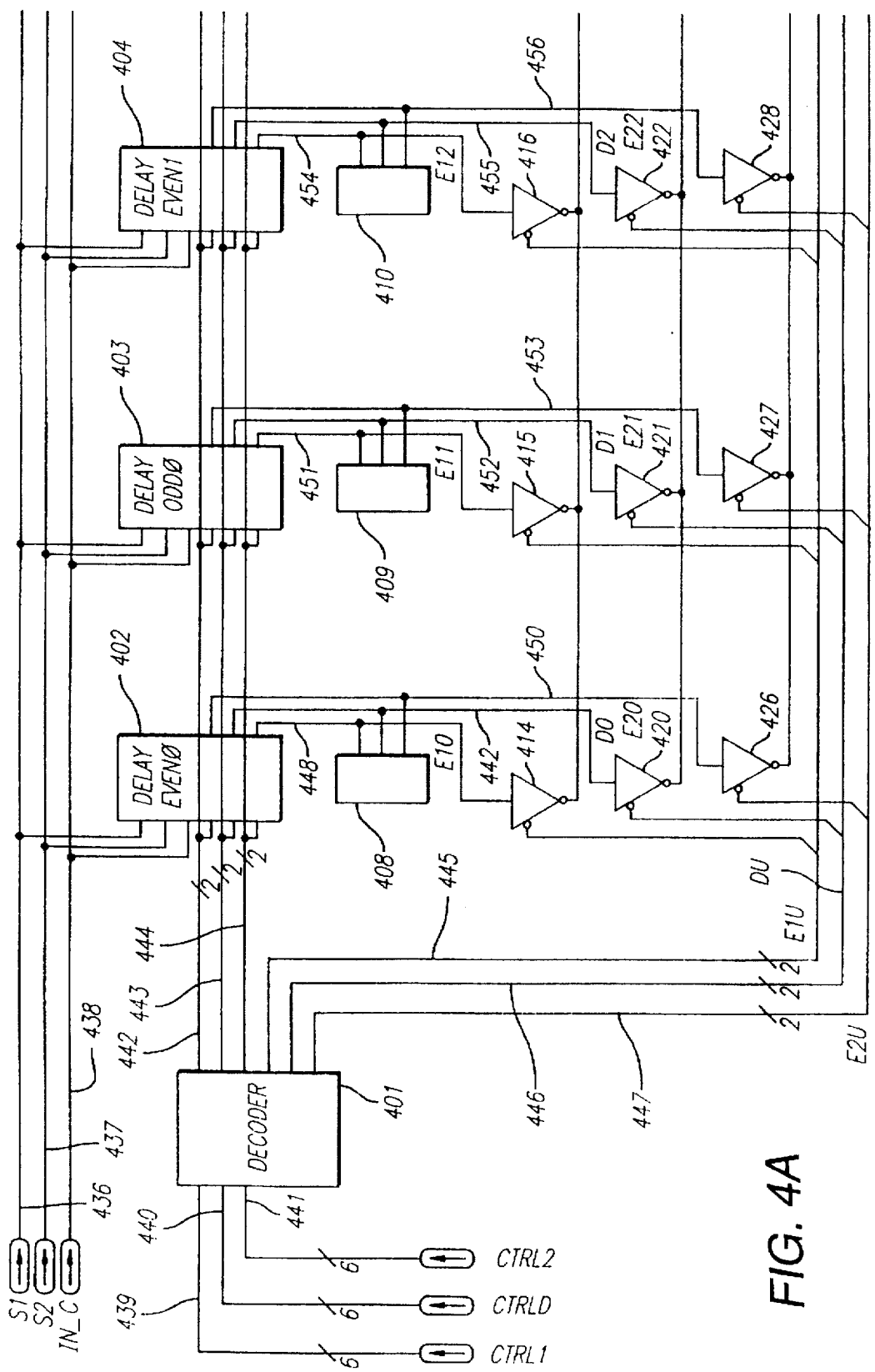
Figure 4B:
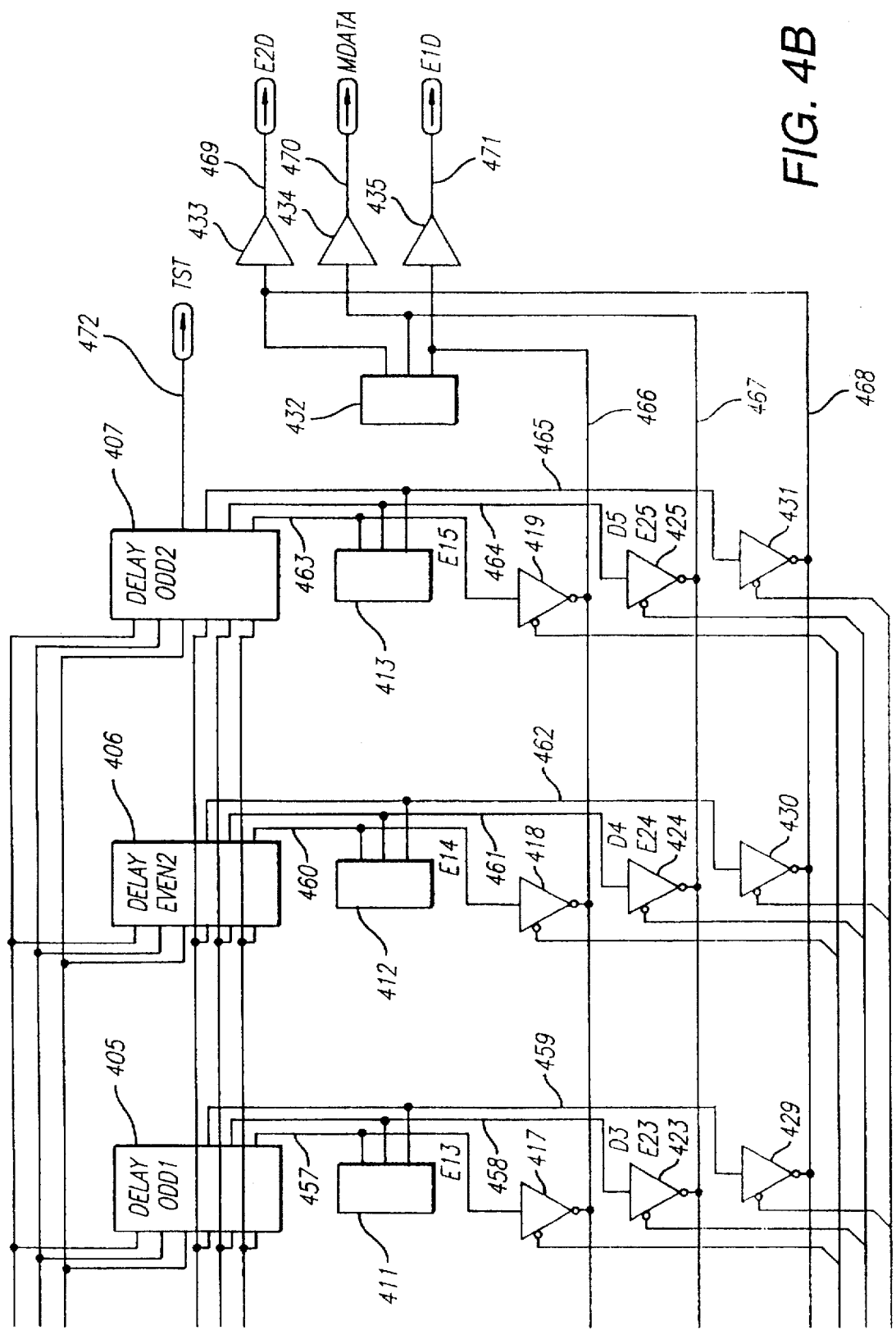

FIGS. 4-1 and 4-2 are a schematic diagram illustrating DLY_UNIT block 202 of the preferred embodiment of the present invention. DLY_UNIT block 202 includes decoder 401; delay circuits 402, 403, 404, 405, 406, and 407; holding circuits 408, 409, 410, 411, 412, and 413; tristate inverters 414, 415, 416, 417, 418, 419, 420, 421, 422, 423, 424, 425, 426, 427, 428, 429, 430, and 431; holding circuit 432; and buffers 433, 434, and 435.

Input S1 is coupled through node 436 to delay circuits 402, 403, 404, 405, 406, and 407. Input S2 is coupled through node 437 to delay circuits 402, 403, 404, 405, 406, and 407. Input INC is coupled through node 438 to delay circuits 402, 403, 404, 405, 406, and 407.

Input CTRL1 is coupled to decoder 401 via 6-bit bus 439. Input CTRLD is coupled to decoder 401 via 6-bit bus 440. Input CTRL2 is coupled to decoder 401 via 6-bit bus 441. Decoder 401 is coupled through 8-bit bus 442 to delay circuits 402, 403, 404, 405, 406, and 407. Decoder 401 is coupled through 8-bit bus 443 to delay circuits 402, 403, 404, 405, 406, and 407. Decoder 401 is coupled through 8-bit bus 444 to delay circuits 402, 403, 404, 405, 406, and 407.

Delay circuit 402 is coupled through node 448 to holding circuit 408 and to an input of tristate inverter 414. Delay circuit 402 is coupled through node 449 to holding circuit 408 and to an input of tristate inverter 420. Delay circuit 402 is coupled through node 450 to holding circuit 408 and to an input of tristate inverter 426. The control terminal of tristate inverter 414 is coupled through 8-bit bus 445 to decoder 401. The output of tristate inverter 414 is coupled through node 466 to holding circuit 432 and to an input of buffer 435. The control terminal of tristate inverter 420 is coupled through 8-bit bus 446 to decoder 401. The output of tristate inverter 420 is coupled through node 467 to holding circuit 432 and to an input of buffer 434. The control terminal of tristate inverter 426 is coupled through 8-bit bus 447 to decoder 401. The output of tristate inverter 426 is coupled through node 468 to holding circuit 432 and to an input of buffer 433.

Delay circuit 403 is coupled through node 451 to holding circuit 409 and to an input of tristate inverter 415. Delay circuit 403 is coupled through node 452 to holding circuit 409 and to an input of tristate inverter 421. Delay circuit 403 is coupled through node 453 to holding circuit 409 and to an input of tristate inverter 427. The control terminal of tristate inverter 415 is coupled through 8-bit bus 445 to decoder 401. The output of tristate inverter 415 is coupled through node 466 to holding circuit 432 and to an input of buffer 435. The control terminal of tristate inverter 421 is coupled through 8-bit bus 446 to decoder 401. The output of tristate inverter 421 is coupled through node 467 to holding circuit 432 and to an input of buffer 434. The control terminal of tristate inverter 427 is coupled through 8-bit bus 447 to decoder 401. The output of tristate inverter 427 is coupled through node 468 to holding circuit 432 and to an input of buffer 433.

Delay circuit 404 is coupled through node 454 to holding circuit 410 and to an input of tristate inverter 416. Delay circuit 404 is coupled through node 455 to holding circuit 410 and to an input of tristate inverter 422. Delay circuit 404 is coupled through node 456 to holding circuit 410 and to an input of tristate inverter 428. The control terminal of tristate inverter 416 is coupled through 8-bit bus 445 to decoder 401. The output of tristate inverter 416 is coupled through node 466 to holding circuit 432 and to an input of buffer 435. The control terminal of tristate inverter 422 is coupled through 8-bit bus 446 to decoder 401. The output of tristate inverter 422 is coupled through node 467 to holding circuit 432 and to an input of buffer 434. The control terminal of tristate inverter 428 is coupled through 8-bit bus 447 to decoder 401. The output of tristate inverter 428 is coupled through node 468 to holding circuit 432 and to an input of buffer 433.

Delay circuit 405 is coupled through node 457 to holding circuit 411 and to an input of tristate inverter 417. Delay circuit 405 is coupled through node 458 to holding circuit 411 and to an input of tristate inverter 423. Delay circuit 405 is coupled through node 459 to holding circuit 411 and to an input of tristate inverter 429. The control terminal of tristate inverter 417 is coupled through 8-bit bus 445 to decoder 401. The output of tristate inverter 417 is coupled through node 466 to holding circuit 432 and to an input of buffer 435. The control terminal of tristate inverter 423 is coupled through 8-bit bus 446 to decoder 401. The output of tristate inverter 423 is coupled through node 467 to holding circuit 432 and to an input of buffer 434. The control terminal of tristate inverter 429 is coupled through 8-bit bus 447 to decoder 401. The output of tristate inverter 429 is coupled through node 468 to holding circuit 432 and to an input of buffer 433.

Delay circuit 406 is coupled through node 460 to holding circuit 412 and to an input of tristate inverter 418. Delay circuit 406 is coupled through node 461 to holding circuit 412 and to an input of tristate inverter 424. Delay circuit 406 is coupled through node 462 to holding circuit 412 and to an input of tristate inverter 430. The control terminal of tristate inverter 418 is coupled through 8-bit bus 445 to decoder 401. The output of tristate inverter 418 is coupled through node 466 to holding circuit 432 and to an input of buffer 435. The control terminal of tristate inverter 424 is coupled through 8-bit bus 446 to decoder 401. The output of tristate inverter 424 is coupled through node 467 to holding circuit 432 and to an input of buffer 434. The control terminal of tristate inverter 430 is coupled through 8-bit bus 447 to decoder 401. The output of tristate inverter 430 is coupled through node 468 to holding circuit 432 and to an input of buffer 433.

Delay circuit 407 is coupled through node 463 to holding circuit 413 and to an input of tristate inverter 419. Delay circuit 407 is coupled through node 464 to holding circuit 413 and to an input of tristate inverter 425. Delay circuit 407 is coupled through node 465 to holding circuit 413 and to an input of tristate inverter 431. The control terminal of tristate inverter 419 is coupled through 8-bit bus 445 to decoder 401. The output of tristate inverter 419 is coupled through node 466 to holding circuit 432 and to an input of buffer 435. The control terminal of tristate inverter 425 is coupled through 8-bit bus 446 to decoder 401. The output of tristate inverter 425 is coupled through node 467 to holding circuit 432 and to an input of buffer 434. The control terminal of tristate inverter 431 is coupled through 8-bit bus 447 to decoder 401. The output of tristate inverter 431 is coupled through node 468 to holding circuit 432 and to an input of buffer 433.

The output of buffer 433 is coupled through node 469 to output E2D. The output of buffer 434 is coupled through node 470 to output MDATA. The output of buffer 435 is coupled through node 471 to output E1D. Delay circuit 407 is coupled through node 472 to output TST.

In the delay unit, DLY_UNIT block 202, three counters select three delay values from a fixed delay line. Two of the counters track the opposing mid bit transitions (1 or 0) and provide outputs E1D and E2D. The third counter maintains the average count of the first and second counter and provide output MDATA. This three counter technique is used to handle the presence of jitters in the Manchester code.

The counters are used to generate delays. The delays are used to adjust the timing of the Manchester coded signal to compensate for jitter. Since jitter may occur as a shift either earlier or later in time, the delays may be shortened or lengthened accordingly.

In order to decode the Manchester coded signal, the present invention provides for the synchronization of the incoming Manchester-encoded data stream with the CLK40 clock signal. A phase lock loop (PLL) circuit in DLY_UNIT block 202 provides synchronization by delaying the incoming Manchester-encoded data stream relative to the CLK40 clock signal. DLY_UNIT block 202 receives the Manchester coded data stream on signal IN_C at node 213 and provides signals E1D at node 219, E2D at node 218, and MDATA at node 211. Signals E1D, E2D, and MDATA are derived from signal IN_C, but each is delayed in time relative to signal IN_C. TTDLOGIC block 203 individually controls the amount of delay introduced to provide signals E1D, E2D, and MDATA.

TTDLOGIC block 203 produces signal E1D by tracking the rising edge of the Manchester coded data. If the rising edge of the Manchester coded data arrives early relative to the transition of the CLK40 clock signal, TTDLOGIC block 203 increases the amount of time by which E1D is delayed. If the rising edge of the Manchester coded data arrives late relative to the transition of the CLK40 clock signal, TTDLOGIC block 203 decreases the duration of the delay for E1D.

TTDLOGIC block 203 produces signal E2D by tracking the falling edge of the Manchester coded data. If the falling edge of the Manchester coded data arrives late relative to the transition of the CLK40 clock signal, TTDLOGIC block 203 decreases the amount of time by which E2D is delayed. If the falling edge of the Manchester coded data arrives early relative to the transition of the CLK40 clock signal, TTDLOGIC block 203 increases the duration of delay for E2D.

TTDLOGIC block 203 produces signal MDATA by averaging the amounts of time by which signals E1D and E2D are delayed. Signal MDATA is delayed by an amount of time equal to the average of the delay of signal E1D and the delay of signal E2D. Signal MDATA represents the incoming Manchester-encoded data stream of input IN_C at node 213 after it has been synchronized with clock signal CLK40. Once synchronized with clock signal CLK40, the incoming Manchester-encoded data stream is decoded to yield valid data.

Since the delay chain of DLY_UNIT 202 is finite and capable of providing a finite range of delay, attempts to adjust delay to synchronize a signal may result in selection of delays at the beginning or the end of the delay chain. To extend the range of delay that the present invention can provide, TTDLOGIC block 203 introduces an offset of an appropriate duration, preferably 25 nanoseconds, to ensure that the appropriate delays fall within the delay range of the delay chain of DLY_UNIT 202 and can be generated by the delay chain. When TTDLOGIC block 203 introduces an offset the period of the clock signal NRZCLK recovered from the Manchester-coded signal may be increased or decreased during the compensation cycle in which the offset is introduced. The increase or decrease will depend on the duration and direction of the offset. For example, if the NRZCLK clock signal typically has a period of 100 nanoseconds, the NRZCLK clock signal may have a duration of 75 nanoseconds or 125 nanoseconds when TTDLOGIC block 203 introduces an offset.

FIGS. 5-1, 5-2 and 5-3 are schematic diagram illustrating TTDLOGIC block 203 of the preferred embodiment of the present invention. TTDLOGIC block 203 includes inverter 501, delay circuit 502, NOR gate 503, resettable D flip-flops 504 and 505, XOR gate 506, logic block 507, resettable D flip-flop 508, logic block 509, inverter 510, inverter 511, NAND gate 512, D flip-flop 513, resettable D flip-flop 514, logic block 515, logic block 516, logic block 517, logic block 518, OR gates 519 and 520, resettable D flip-flops 521, 522, 523, and 524, buffer 525, inverter 526, buffers 527, 528, and 529, logic block 530, NAND gate 531, inverters 532, 533, 534, 535, 536, 537, and 538, and NOR gate 539.

Input E1D is coupled via node 543 to the D input of resettable D flip-flop 504. Input CLK40 is coupled via node 540 to an input of inverter 501, to a clock input of D flip-flop 513, to logic block 509, and to a clock input of each of resettable D flip-flops 521, 522, 523, and 524. The output of inverter 501 is coupled via node 541 to an input of NOR gate 503. The output of NOR gate 503 is coupled via node 542 to logic block 507, to the D input of resettable D flip-flop 514, and to the clock input of each of resettable D flip-flops 504, 505, 508, and 514.

Input RSTN is coupled through node 547 to an input of inverter 511, to an input of NAND gate 512, to data logic block 530, to logic block 515, to logic block 516, to logic block 517, to logic block 518, and to the R̄ (reset) input of each of resettable D flip-flops 504, 505, 508, 514, 521, 522, 523, and 524. The output of inverter 511 is coupled through node 548 to logic block 507. The Q output of resettable D flip-flop 504 is coupled through node 544 to the D input of resettable D flip-flop 505 and to an input of XOR gate 506. The Q output of resettable D flip-flop 505 is coupled through node 545 to an input of XOR gate 506. The output of XOR gate 506 is coupled through node 546 to logic block 507 and to logic block 509.

Logic block 509 is coupled through node 551 to logic block 507. Logic block 507 is coupled through node 552 to the D input of resettable D flip-flop 508. The Q output of resettable D flip-flop is coupled through node 553 to logic block 509 and to delay circuit 502. Delay circuit 502 is coupled to an input of NOR gate 503. The Q̄ output of resettable D flip-flop 514 is coupled through node 555 to an input of NAND gate 512. The output of NAND gate 512 is coupled through node 556 to logic block 509. The Q̄ output of resettable D flip-flop 505 is coupled through node 549 to an input of inverter 510. The output of inverter 510 is coupled through node 550 to data logic block 530.

Input UPR is coupled through node 556 to the D input of D flip-flop 513. The output of D flip-flop 513 is coupled through node 557 to logic block 509. Logic block 509 is coupled through node 559 to the D input of resettable D flip-flop 521. Logic block 509 is coupled through node 560 to the D input of resettable flip-flop 522. Logic block 509 is coupled through node 561 to the D input of resettable flip-flop 523. Logic block 509 is coupled through node 562 to the D input of resettable flip-flop 524.

The Q output of resettable D flip-flop 521 is coupled through node 562 to an input of buffer 525. The output of buffer 525 is coupled through node 567 to data logic block 530. The Q output of resettable D flip-flop 521 is coupled through node 563 to an input of inverter 526. The output of inverter 526 is coupled through node 568 to an input of NOR gate 539. The Q output of resettable D flip-flop 522 is coupled through node 564 to an input of buffer 527. The output of buffer 527 is coupled through node 569 to data logic block 530. The Q output of resettable D flip-flop 523 is coupled through node 565 to an input of buffer 528. The output of buffer 528 is coupled through node 570 to data logic block 530. The Q output of resettable D flip-flop 524 is coupled through node 566 to an input of buffer 529. The output of buffer 529 is coupled through node 571 to data logic block 530 and to an input of NAND gate 531.

Logic block 515 is coupled through node 574 to data logic block 530. Logic block 515 is coupled through node 572 to data logic block 530. Logic block 515 is coupled through node 595 to logic block 516, to logic block 517, and to logic block 518. Logic block 516 is coupled through node 578 to data logic block 530. Logic block 516 is coupled through node 579 to data logic block 530. Logic block 517 is coupled through node 576 to data logic block 530. Logic block 517 is coupled through node 577 to data logic block 530. Logic block 518 is coupled through node 580 to data logic block 530. Logic block 518 is coupled through node 581 to data logic block 530. Logic block 517 is coupled through node 575 to data logic block 530.

Input MDATA is coupled through node 5106 to data logic block 530. Input E1D is coupled through node 5107 to data logic block 530. Input E2D is coupled through node 5108 to data logic block 530. Data logic block 530 is coupled through node 582 to output NRZDATA. Data logic block 530 is coupled through node 583 to output NRZCLK. Data logic block 530 is coupled through node 584 to output ENDMAN.

Input CTRL1 is coupled via 6-bit bus 5103 to logic block 516. Input CTRLD is coupled via 6-bit bus 5104 to logic block 517. Input CTRL2 is coupled via 6-bit bus 5105 to logic block 518. Logic block 516 is coupled through bus 596 to logic block 517 and to logic block 518. Logic block 516 is coupled through bus 599 to logic block 517. Logic block 517 is coupled through bus 597 to logic block 518. Logic block 515 is coupled through node 573 to data logic block 530 and to logic block 517.

Logic block 516 is coupled through node 5100 an input of NOR gate 519. Logic block 516 is coupled through node 598 to an input of NOR gate 520. Logic block 518 is coupled through node 5101 to an input of NOR gate 519. Logic block 518 is coupled through node 5102 to an input of NOR gate 520. The output of NOR gate 519 is coupled through node 558 to output LWR and to logic blocks 509, 516, and 518. The output of NOR gate 520 is coupled through node 585 to output UPR, to logic block 516, to logic block 518, and to an input of NAND gate 531.

The output of NAND gate 531 is coupled through node 586 to an input of inverter 532. The output of inverter 532 is coupled through node 587 to an input of inverter 533. The output of inverter 533 is coupled through node 588 to an input of inverter 534. The output of inverter 534 is coupled through node 589 to an input of inverter 535. The output of inverter 535 is coupled through node 590 to an input of inverter 536. The output of inverter 536 is coupled through node 591 to an input of inverter 537. The output of inverter 537 is coupled through node 592 to an input of inverter 538. The output of inverter 538 is coupled through node 593 to an input of NOR gate 539. The output of NOR gate 539 is coupled through node 594 to logic blocks 515, 516, 517, and 518.

In TTDLOGIC block 203, the three individually delayed Manchester code signals from DLY_UNIT 202 are sampled using a four phase clock (phase 1 to phase 4 at 25 nanoseconds intervals). IEEE standard 802.3 specifies a Manchester code consisting of 60 bits of alternate ones and zeros followed by two ones and the data information. During the preamble reception, TTDLOGIC block 203 performs training by adjusting the delay of the Manchester code such that the mid-bit transition happens at the phase 3 clock. It also trains to determine the count value for a 25 nanoseconds delay. This count value is used for delay offset adjustments during operation if there is a difference between the Manchester recovered clock and the system clock frequency.

During data and clock recovery process, TTDLOGIC block 203 dynamically tracks the mid-bit transition of the Manchester code. If the Manchester clock is faster than the system clock, the delay count will increase to track the mid-bit transition to phase 3 clock. When the count limit is reached, the 25 nanoseconds offset value will be subtracted from the three counters to prevent count overflow. TTDLOGIC block 203 will compensate by removing one phase from this cycle. If the Manchester clock is slower than the system clock, the delay count will decrease to track the mid-bit transition to phase 3 clock. When the count limit is reached, the 25 nanoseconds offset value will be added from the three counters to prevent count underflow. TTDLOGIC block 203 will compensate by adding one more phase from this cycle. This addition or deletion of 25 nanoseconds (one phase) is termed "phase slip".

By having a fixed decoder clock to decode the Manchester code, "phase slip" can occur when TTDLOGIC block 203 has to add or subtract one phase due to slight clock mismatches. The present invention also provides a circuit to maintain a constant 10 MHz recovered clock. Since the Ethernet packets defined by IEEE standard 802.3 have a maximum length specified, the maximum number of "phase slips" can be determined. The correction circuit uses a bank of flip flops to prestore the decoded data and to adjust for the phase slips to maintain a constant recovered clock.

Figure 6:
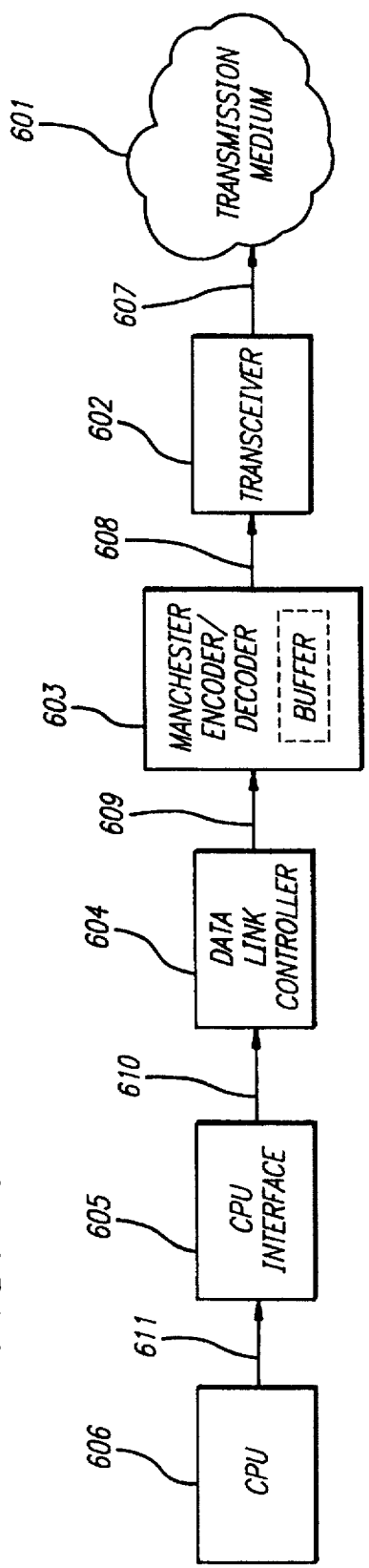
FIG. 6 is a block diagram illustrating a network interface controller with which the present invention may be practiced.

FIG. 6 is a block diagram illustrating a network interface controller with which the present invention may be practiced. Transmission medium 601, which may be, for example, twisted pair metallic conductors, coaxial cable, fiber optic cable, wireless electromagnetic propagation, or another suitable medium, is coupled through interconnection 607 to transceiver 602. Transceiver 602 is coupled through interconnection 608 to Manchester encoder/decoder 603. Manchester encoder/decoder 603 is coupled through interconnection 609 to data link controller 604. Data link controller 604 is coupled through interconnection 610 to CPU interface 605. CPU interface 605 is coupled through interconnection 611 to central processing unit (CPU) 606.

Transceiver 602 adapts the interface at interconnection 608, which may conform, for example, to the IEEE standard 802.3 attachment unit interface (AUI) specification, to the interface at interconnection 607, which is of a type appropriate for transmission medium 601. Manchester encoder/decoder 603 processes the signals present at interface 608. The decoder portion of Manchester encoder/decoder 603 separates a received data signal and a received clock signal from a signal received by transceiver 602 from transmission medium 601. The encoder portion of Manchester encoder/ decoder 603 produces a signal to be transmitted over transmission medium 601 by transceiver 602 from a transmit data signal and a transmit clock signal.

Data link controller 604 controls the operation of the other components to provide compliance with the desired network communications protocol. For example, data link controller 604 may provide control to support the ISO/ANSI/IEEE 8802-3 CSMA/CD (collision sense multiple access/carrier detect) protocol. Data link controller 604 may be practiced with transmit circuitry, receive circuitry, and other circuitry, such as cyclic redundancy check (CRC) logic to provide error detection. Data link controller 604 may be used to assemble data into the appropriate form for transmission over a network and may be used to add a preamble, delimiting information, padding data, and checksum information to the data to be transmitted. Thus, data link controller 604 may be used to convert data to be transmitted into a data packet compatible with a network. Data link controller communicates transmit signals, receive signals, and other signals, such as control signals, to and from Manchester encoder/decoder 603 through interconnection 609.

CPU interface 605 adapts signals from data link controller 604 that are present at interconnection 610 to a form compatible with CPU 606 and couples the adapted signals to CPU 606 through interconnection 611. CPU interface also adapts signals from CPU 606 that are present at interconnection 611 to a form compatible with data link controller 604 and couples the adapted signals to data link controller 604 through interconnection 610. CPU 606 may be any suitable type of central processing unit, such as a general purpose computer.

Information from CPU 606 to be transmitted over transmission medium 601 passes through CPU interface 605, data link controller 604, Manchester encoder/decoder 603, and transceiver 602. Information from transmission medium 601 directed to CPU 606 passes through these elements in the opposite direction.

Figure 7:
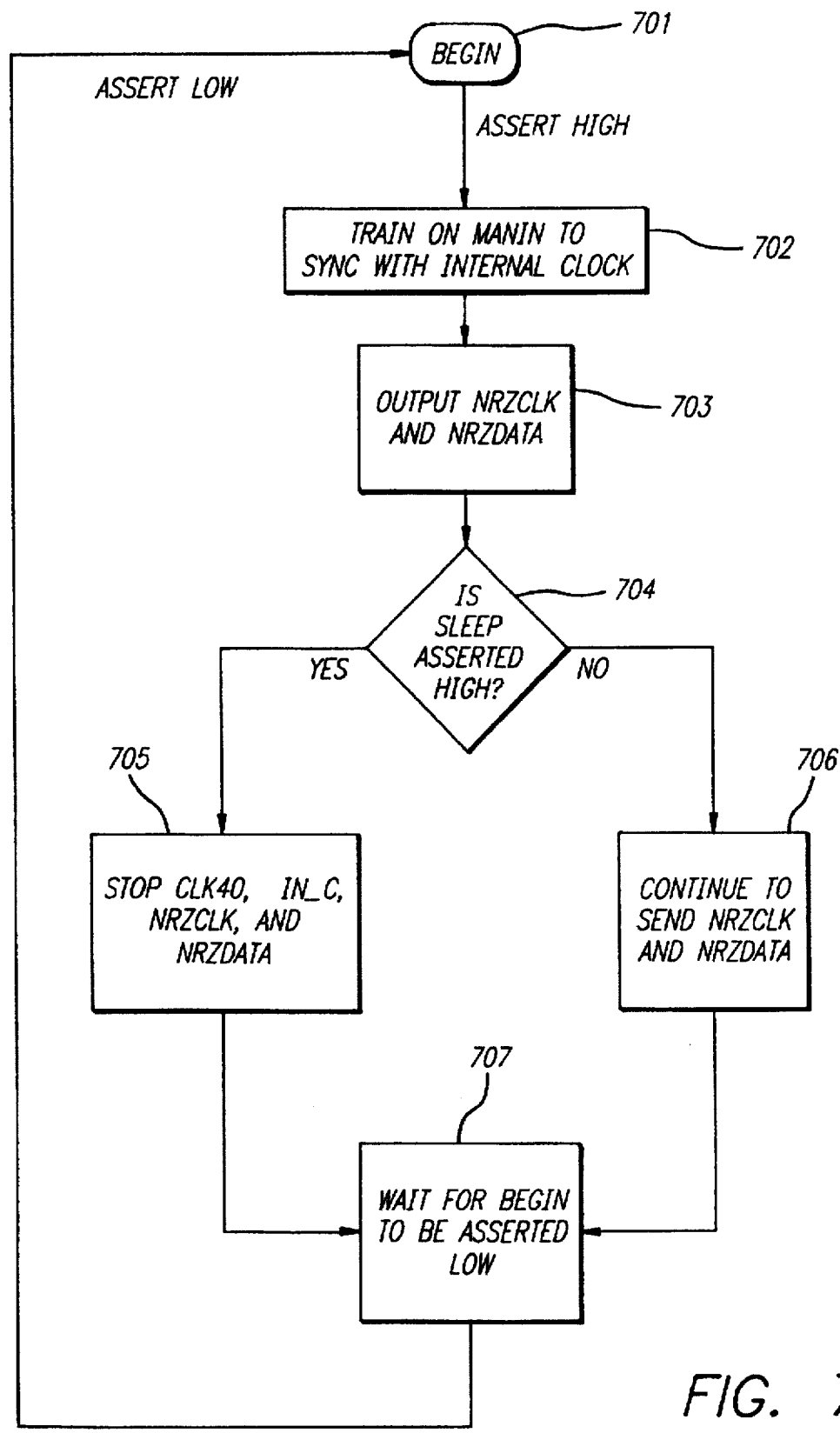
FIG. 7 is a flow diagram illustrating one embodiment of a method according to the present invention.

FIG. 7 is a flow diagram illustrating one embodiment of a method according to the present invention. At step 701, the process waits for BEGIN to be asserted high. When BEGIN is asserted high, the process proceeds from step 701 to step 702. In step 702, a training operation occurs to train on the MANIN signal so as to achieve synchronization with the internal clock of the Manchester decoder. The MANIN signal is delayed an appropriate period of time to provide the desired synchronization.

When the MANIN signal has been synchronized with the internal clock, the clock and data signals are extracted from the Manchester coded signal. In step 703, the NRZCLK and NRZDATA signals are output. In step 704, a decision is performed based on the status of the SLEEP signal. If the SLEEP signal is not asserted high, the output of the NRZCLK and NRZDATA signals is continued in step 706. If the NRZCLK and NRZDATA signals reach their conclusion at the end of the current packet of data without having had the SLEEP signal asserted high, the process proceeds to step 707. However, if the SLEEP signal is asserted high, further Manchester-encoded input signals are not decoded, and, in step 705, the NRZCLK and NRZDATA signals are stopped when the Manchester decoder finishes decoding the signals already received. When the NRZCLK and NRZDATA signals are finished, the process proceeds to step 707.

In step 707, the process waits for the BEGIN signal to be asserted low. When the BEGIN signal is asserted low, the process proceeds to step 701, where the process waits for the BEGIN signal to be asserted high.

Figure 8:
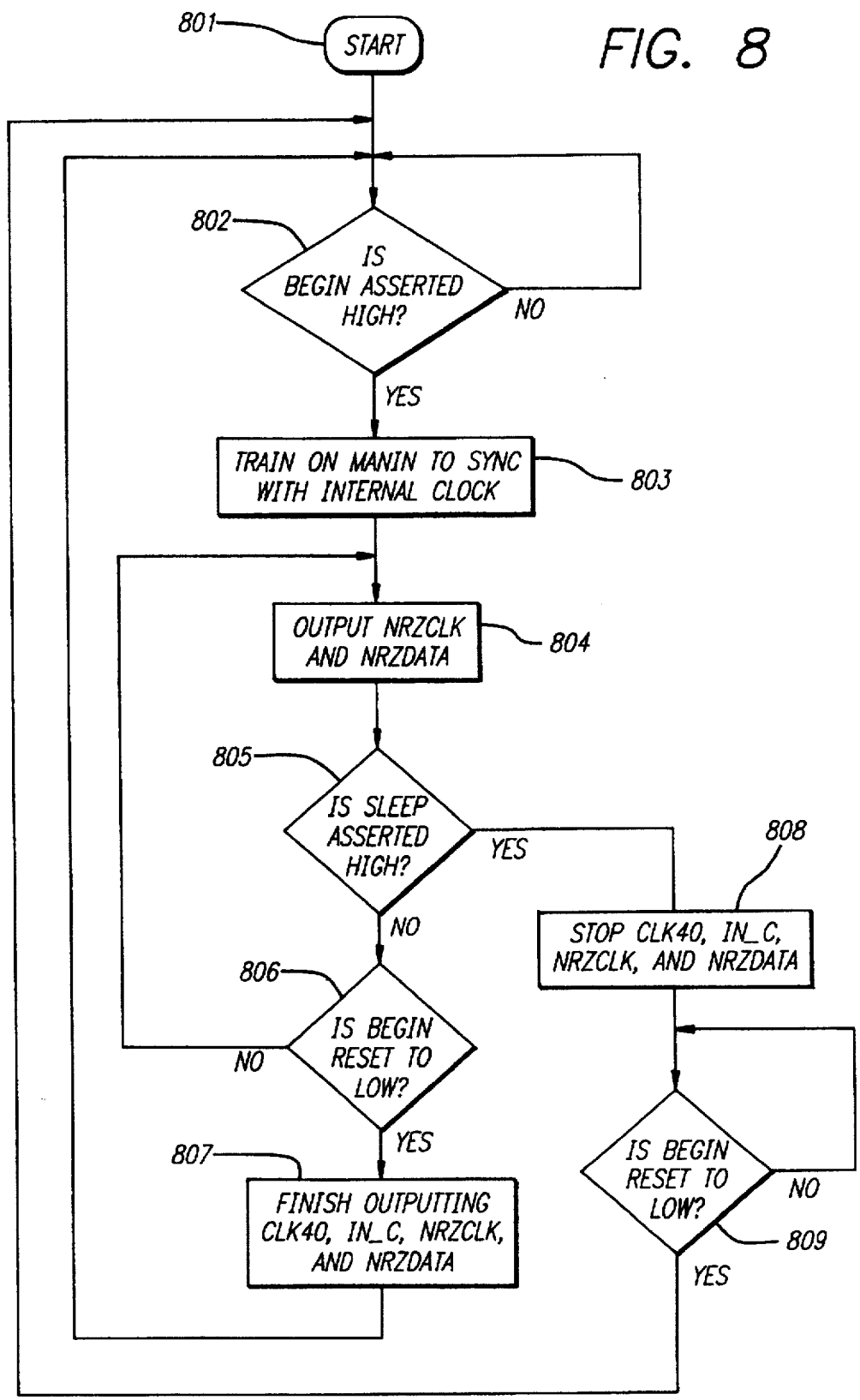
FIG. 8 is a flow diagram illustrating one embodiment of a method according to the present invention.

FIG. 8 is a flow diagram illustrating one embodiment of a method according to the present invention. The process starts at step 801 and proceeds to step 802. In step 802, if the BEGIN signal is asserted high, the process proceeds to step 803. If the BEGIN signal is not asserted high, the process remains at step 802, still waiting for BEGIN to be asserted high.

In step 803, the MANIN signal is trained on the internal clock, synchronizing it with the internal clock. Once the MANIN signal is properly synchronized with the internal clock, it is processed by the Manchester decoder to extract clock and data signals. After synchronization has occurred, step 804 begins. In step 804, outputting of the NRZCLK and NRZDATA signals begins. After the outputting of NRZCLK and NRZDATA has begun, a decision is made in step 805 depending upon whether the SLEEP signal is asserted high. If the SLEEP signal is asserted high, the Manchester decoder stops receiving the MANIN signal and completes processing the portion of the MANIN signal already received. When the Manchester decoder has finished outputting the processed signals, CLK40, IN_C, NRZCLK, and NRZDATA stop in step 808.

After step 808, the process proceeds to step 809, where a decision is made based on whether the BEGIN signal is reset to low. If the BEGIN signal is not reset to low, the process remains at step 809, waiting for the BEGIN signal to be reset to low. When the BEGIN signal is reset to low, the process proceeds to step 802.

If, in step 805, the SLEEP signal is not asserted high, a decision is made in block 806 depending on whether the BEGIN signal is reset to low. If the BEGIN signal is reset to low, the signals CLK40, IN_C, NRZCLK, and NRZDATA are output until finished. Then, the process continues at step 802.

Figure 9:
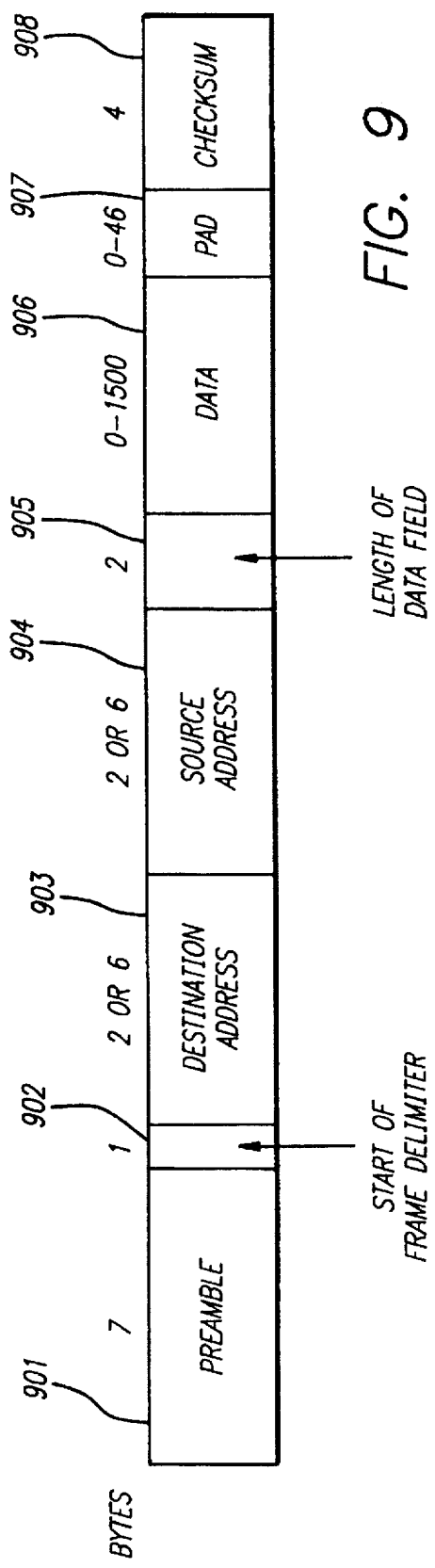
FIG. 9 is a diagram illustrating a typical frame structure of a data packet.

FIG. 9 is a diagram illustrating a typical frame structure of a data packet. The frame begins with preamble 901, typically of 7 bytes in length and following the pattern 10101010. After Manchester encoding, this pattern results in a regular square wave pattern that allows synchronization during the Manchester decoding process. After preamble 901 is transmitted, start of frame delimiter 902, which typically is one byte long and contains the pattern 10101011, is transmitted. Following start of frame delimiter 902 is destination address 903, then source address 904, each of which has a typical length of 2 or 6 bytes. Length of data field 905 has a typical length of 2 bytes and follows source address 904. Length of data field 905 indicates the number of bytes present in data field 906. Length of data field 905 may have a value between 0 and 1500, but usually does not have a value less than 46.

Following length of data field 905 is data field 906, which typically contains between 0 and 1500 bytes of data. Pad field 907 follows data field 906. Pad field 907 typically contains 0 to 46 bytes and is used to compensate for a data field 906 of insufficient length. Since collision sense multiple access/collision detect (CSMA/CD) networks are designed to detect collisions on the network of data packets from different senders, a minimum packet length (typically of 64 bytes from destination address 903 to checksum 908) is often employed to ensure sufficient duration of a data packet to allow it to propagate across the network so that all nodes on the network will be able to determine whether the data packet is valid or has been corrupted by the effects of a collision with another data packet. If a data field 906 has a length less than, for example, 46 bytes, bytes are added to pad field 907 to ensure the minimum packet length requirement is met.

Finally, after pad field 907, checksum 908, which typically contains 4 bytes is transmitted. A cyclic redundancy check is typically used for checksum 908. The checksum has a value based on the content of the preceding fields and is calculated by a known algorithm. Thus, almost any error that occurs in the transmission of the data packet causes the value of the calculated checksum to differ from the value of the transmitted checksum and results in detection of the error.

Figure 10A:
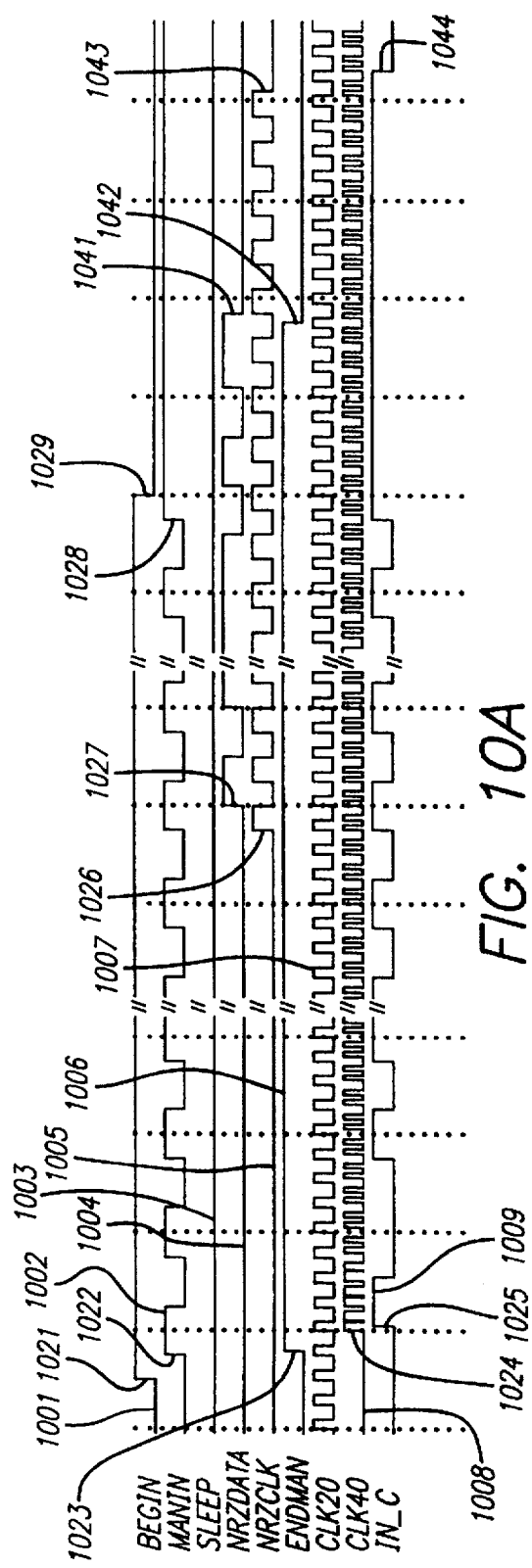
FIG. 10A is a timing diagram illustrating examples of several signals present in an embodiment of the present invention where the SLEEP signal is not activated for the duration of the processing of a data packet.
Figure 10B:
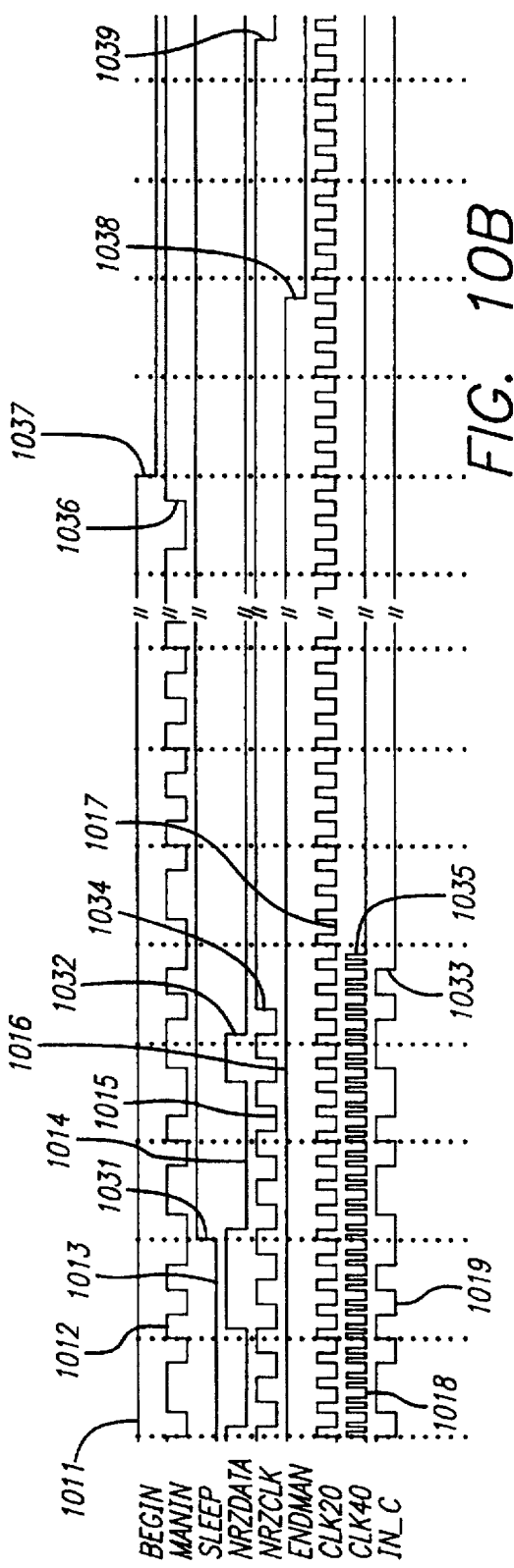
FIGS. 10B is a timing diagram illustrating examples of several signals present in an embodiment of the present invention where the SLEEP signal is activated during processing of a data packet.

FIGS. 10A and 10B are timing diagrams illustrating examples of several signals present in an embodiment of the present invention. FIG. 10A is an example where the SLEEP signal is not activated for the duration of the processing of a data packet. The BEGIN signal is illustrated by waveform 1001. The MANIN signal is illustrated by waveform 1002. The SLEEP signal is illustrated by waveform 1003. The NRZDATA signal is illustrated by waveform 1004. The NRZCLK signal is illustrated by waveform 1005. The ENDMAN signal is illustrated by waveform 1006. The CLK20 signal is illustrated by waveform 1007. The CLK40 signal is illustrated by waveform 1008. The IN_C signal is illustrated by waveform 1009.

The BEGIN signal goes from low to high at transition 1021. After transition 1021 occurs, the MANIN signal conveys valid information, beginning at transition 1022, and the ENDMAN signal goes from low to high at transition 1023. The CLK40 clock signal becomes active after transition 1021, beginning at transition 1024. The IN_C signal also conveys valid information after transition 1021, beginning at transition 1025.

After the MANIN signal is processed by the Manchester decoder, the Manchester decoder produces the NRZCLK and NRZDATA signals, beginning at transitions 1026 and 1027, respectively. At transition 1028, the MANIN signal finishes conveying valid information. Following transition 1028, the BEGIN signal goes from high to low at transition 1029. When the Manchester decoder finishes processing the received Manchester encoded signal, it finishes transmitting the NRZDATA signal, ending at transition 1041, and the NRZCLK signal, ending at transition 1043, and the IN_C signal goes from high to low at transition 1044. When the NRZDATA signal concludes at transition 1041, the ENDMAN signal goes from high to low at transition 1042.

FIG. 10B is an example where the SLEEP signal is activated. The BEGIN signal is illustrated by waveform 1011. The MANIN signal is illustrated by waveform 1012. The SLEEP signal is illustrated by waveform 1013. The NRZDATA signal is illustrated by waveform 1014. The NRZCLK signal is illustrated by waveform 1015. The ENDMAN signal is illustrated by waveform 1016. The CLK20 signal is illustrated by waveform 1017. The CLK40 signal is illustrated by waveform 1018. The IN_C signal is illustrated by waveform 1019.

The SLEEP signal goes from low to high at transition 1031. While the MANIN signal continues to convey valid information until transition 1036, the BEGIN signal remains high until it goes low at transition 1037, and the ENDMAN signal remains high until it goes low at transition 1038. Since the SLEEP signal prevents the Manchester decoder of the present invention from accepting further Manchester-encoded input signals, the Manchester decoder continues to process the signals already received and outputs the NRZDATA and NRZCLK signals until their completion at transitions 1032 and 1034, respectively. As the activity of the Manchester decoder ceases, the oscillations of the IN_C signal and the CLK40 signal stop at transitions 1033 and 1035, respectively. At transition 1039, the NRZCLK signal goes from high to low.

As stated earlier, the present invention may be practiced with the network interface controller illustrated in FIG. 6.

When data is transmitted via transmission medium 601, it is received at physical layer transceiver 602. When physical layer transceiver detects the beginning of a Manchester-encoded data stream, it causes the BEGIN signal to go high and provides the data stream to Manchester encoder/decoder 603 as the MANIN signal. Manchester encoder/decoder 603 processes the MANIN signal to recover data in a non-return-to-zero format (NRZDATA) and a clock signal (NRZCLK). The CLK20 signal is a clock signal, preferably having a frequency of 20 MHz. The CLK40 signal is a clock signal, preferably having a frequency of 40 MHz. The CLK40 signal is preferably internally generated from the CLK20 signal and used within Manchester encoder/decoder 603. Manchester encoder/decoder 603 trains on the incoming Manchester-encoded data stream by internally adjusting delay cells that delay the MANIN signal until the MANIN signal is matched to the CLK40 clock signal.

The NRZDATA and NRZCLK signals are provided to data link controller 604. The ENDMAN signal is generated by Manchester encoder/decoder 603. While Manchester encoder/decoder 603 is decoding the incoming Manchester-encoded data stream, Manchester encoder/decoder 603 maintains the ENDMAN signal in a high logic state. After Manchester encoder/decoder 603 has detected no signal transition in the incoming Manchester-encoded data stream for a period of time, preferably 200 nanoseconds, Manchester encoder/decoder 603 resets the ENDMAN signal to a low logic state to indicate the end of valid Manchester-encoded signals in the incoming Manchester-encoded data stream. Data link controller 604 receives the ENDMAN signal and continues to process the NRZDATA until the ENDMAN signal goes low.

According to the present invention, data link controller 604 asserts the SLEEP signal if the destination address of a received data packet does not match pre-programmed criteria. When the SLEEP signal is asserted, Manchester encoder/decoder 603 enters a power saving mode and stops decoding the incoming MANIN signal. When the power saving mode is entered, the CLK40 signal and the IN_C signal stop. With the CLK40 and IN_C signals inactive, the TEDLOGIC and DLY_UNIT blocks enter a quiescent state. When the SLEEP signal is asserted, the physical layer transceiver continues to monitor the end of the incoming data stream and to cause the BEGIN signal to go low at the appropriate time.

The WAKEUP_signal can be asserted to override the SLEEP signal and to prevent Manchester encoder/decoder 603 from entering the power saving mode, if desired. The RESET signal may be asserted to reset the system and is typically used to reset the system when power is initially applied to the system.

The Manchester decoder of the present invention adjusts the timing of the data stream to synchronize it with an internal clock, avoiding the need to adjust an internal clock to achieve synchronization. The DLY_UNIT block provides a phase lock loop, while the TTDLOGIC block receives feedback signals from the DLY_UNIT block and controls the amount of delay to be applied to the incoming Manchester-encoded data stream so as to allow data and clock signals to be recovered from the Manchester-encoded data stream.

To handle jitters in the incoming Manchester-encoded data stream, the DLY_UNIT block provides the E1D, E2D, and MDATA signals. The E1D and E2D signals represent the amounts of delay necessary to compensate for rising and falling edge transitions that occur mid-bit to allow recovery of an incoming signal affected by jitter. The MDATA signal represents the average between the E1D and E2D signals and is used for generating the NRZCLK and NRZDATA signals.

The ability to power down the decoder for power saving is significant for portable applications. The present invention calibrates and trains when a Manchester code is received. However, when no Manchester code is being received, no calibration or training needs to occur. Thus, all of the clocks of the present invention may be switched off when the decoder is not needed. The present invention provides the additional advantage that it can handle jitters beyond ±18 nanoseconds.

In one embodiment of the present invention, a post decision method provides frequency compensation. Since standards, such as ANSI/IEEE Std. 802.3, often specify clock accuracy and maximum data length, a buffer circuit is used in one embodiment of the present invention to temporarily store data as the data are decoded from a Manchester-coded signal. The data are clocked out of the buffer circuit at a rate that complies with applicable standards. Thus, even if the present invention inserts a temporal offset in the Manchester-coded signal to ensure the ability to synchronize the Manchester-coded signal with an internal clock signal, the NRZCLK clock signal recovered from the Manchester-coded signal maintains a constant period. By maintaining a constant period of the NRZCLK clock signal, the buffer circuit of this embodiment of the present invention compensates for any variations in frequency of the NRZCLK clock signal.

In one embodiment of the present invention, the physical layer transceiver detects the presence of a Manchester-encoded data stream at the network connection and causes the BEGIN signal to go high. When the Manchester-encoded data stream is no longer present, the physical layer transceiver causes the BEGIN signal to go low. When the BEGIN signal transitions from low to high, the Manchester decoder is activated, as are the clock signals it uses, and is prepared to accept an incoming Manchester-encoded data stream. When the Manchester decoder is finished processing the incoming Manchester-encoded data stream and outputting the clock and data signals derived therefrom, the Manchester decoder is deactivated, as are the clock signals it uses, thereby putting the system into a power saving quiescent mode.

The present invention also provides a feature to further reduce unnecessary power consumption. When an incoming Manchester-encoded data stream passes through the physical layer transceiver and arrives at the Manchester decoder, the Manchester decoder extracts the clock and data information contained in the Manchester-encoded data stream and passes it to the data link controller. Since the data link controller controls the assembly and disassembly of data flames (an example of which is illustrated in FIG. 9), the data link controller can extract the destination address from a data frame. The data link controller is programmed to compare a destination address recovered from the incoming Manchester-encoded data stream to a pre-defined address qualification. The pre-defined address qualification may be based on a particular destination address, a group of addresses, a pattern which may be present in an address, a group of such patterns, some combination of the foregoing, or any other information contained in an address to which is the system is desired to be responsive. The data link controller generates signals in response to the outcome of the comparison of the recovered destination address to the pre-defined address qualification.

If the destination address of the incoming data frame matches the address qualification programmed in the data link controller, the data link controller maintains the SLEEP signal in a low state. With SLEEP low, the clock signals and Manchester decoder remain active, and the Manchester decoder continues to decode the remainder of the data frame and output the resulting clock and data signals. However, if the destination differs from the address qualification which the data link controller has been programmed to recognize, the data link controller causes the SLEEP signal to go to a high state. When the SLEEP signal goes to a high state, clock signals used by the Manchester decoder are halted, and the Manchester decoder is placed in a quiescent mode. Thus, the Manchester decoder stops processing the remainder of the incoming data stream, either immediately or after processing and outputting that which it has already received, and avoids consuming unnecessary power. Since the destination address is located very near the beginning of the data frame and the Manchester decoder can be placed in a power saving mode during the potentially long remainder of the data frame, the present invention provides substantial power saving capability.

Figure 11:
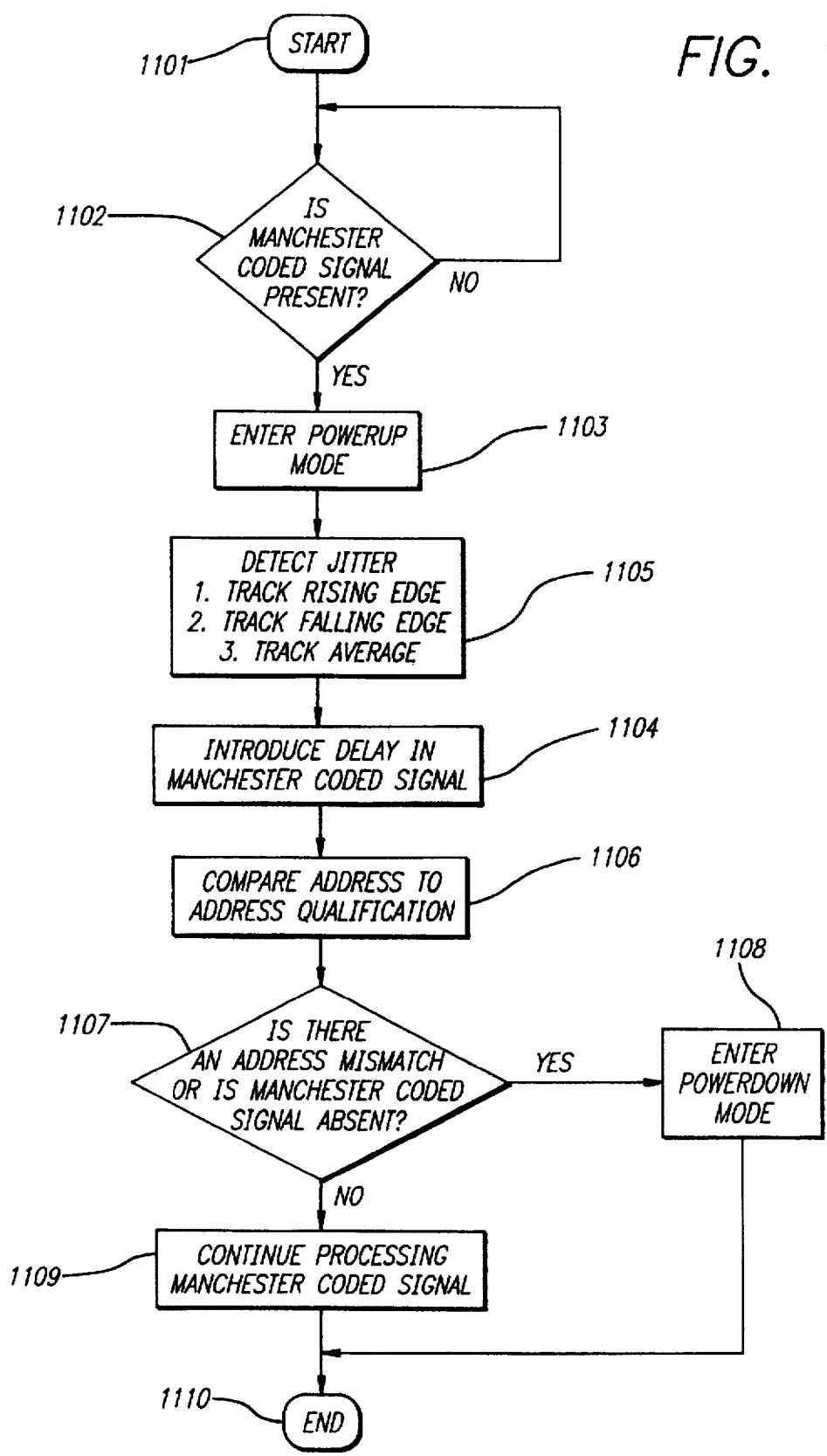
FIG. 11 is a flow diagram illustrating one embodiment of the method of the present invention.

FIG. 11 is a flow diagram illustrating one embodiment of the method of the present invention. The process begins in step 1101. Then, in step 1102, a check is made as to whether a Manchester coded signal is present. If a Manchester coded signal is present, the Manchester decoder is activated in seep 1103. The activation may be made by applying power, applying a clock signal, or some other stimulus to the Manchester decoder. In step 1104, jitter detection is performed. The jitter detection step involves tracking rising edge transitions, tracking falling edge transitions, and tracking an average derived from the rising edge transitions and falling edge transitions. In step 1105, delay appropriate to compensate for jitter is introduced in the Manchester coded signal.

In step 1106, an address contained in the Manchester coded signal is compared to an address qualification. In step 1107, a test is performed to determine if there is an address mismatch between the address and the address qualification and also to determine if the Manchester coded signal is no longer present. If the there is either an address mismatch or the Manchester coded signal is absent, the Manchester decoder is placed in a powerdown mode in step 1108. The powerdown mode may be achieved by removing power from the Manchester decoder, by removing clock signals from the Manchester decoder, or by taking other action to reduce the activity of the Manchester decoder. If there is no address mismatch and the Manchester coded signal is still present, the system continues to process the Manchester coded signal in step 1109. After steps 1108 or 1109, the process ends in step 1110.

Figure 12:
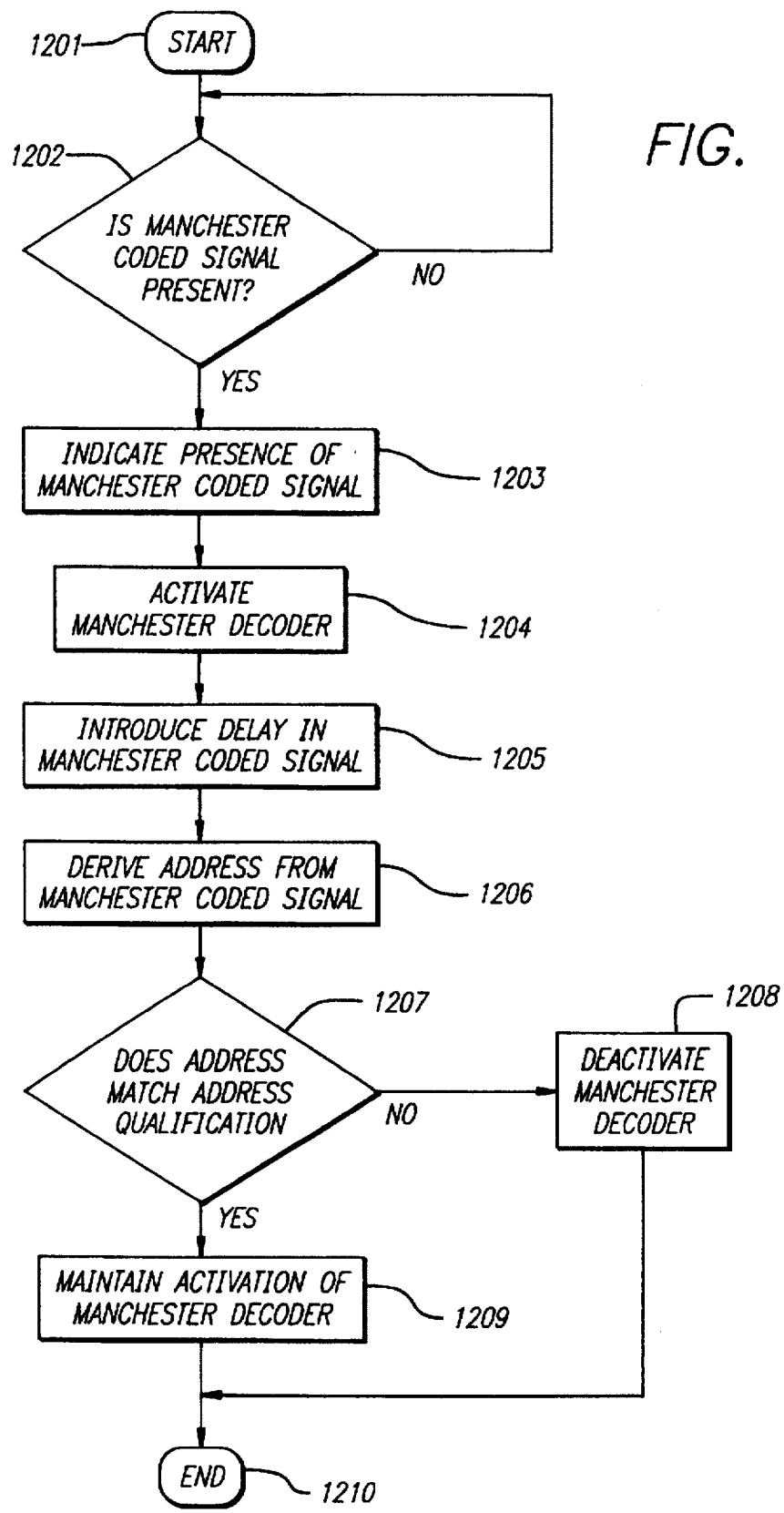
FIG. 12 is a flow diagram illustrating one embodiment of the method of the present invention.
Figure 13A:
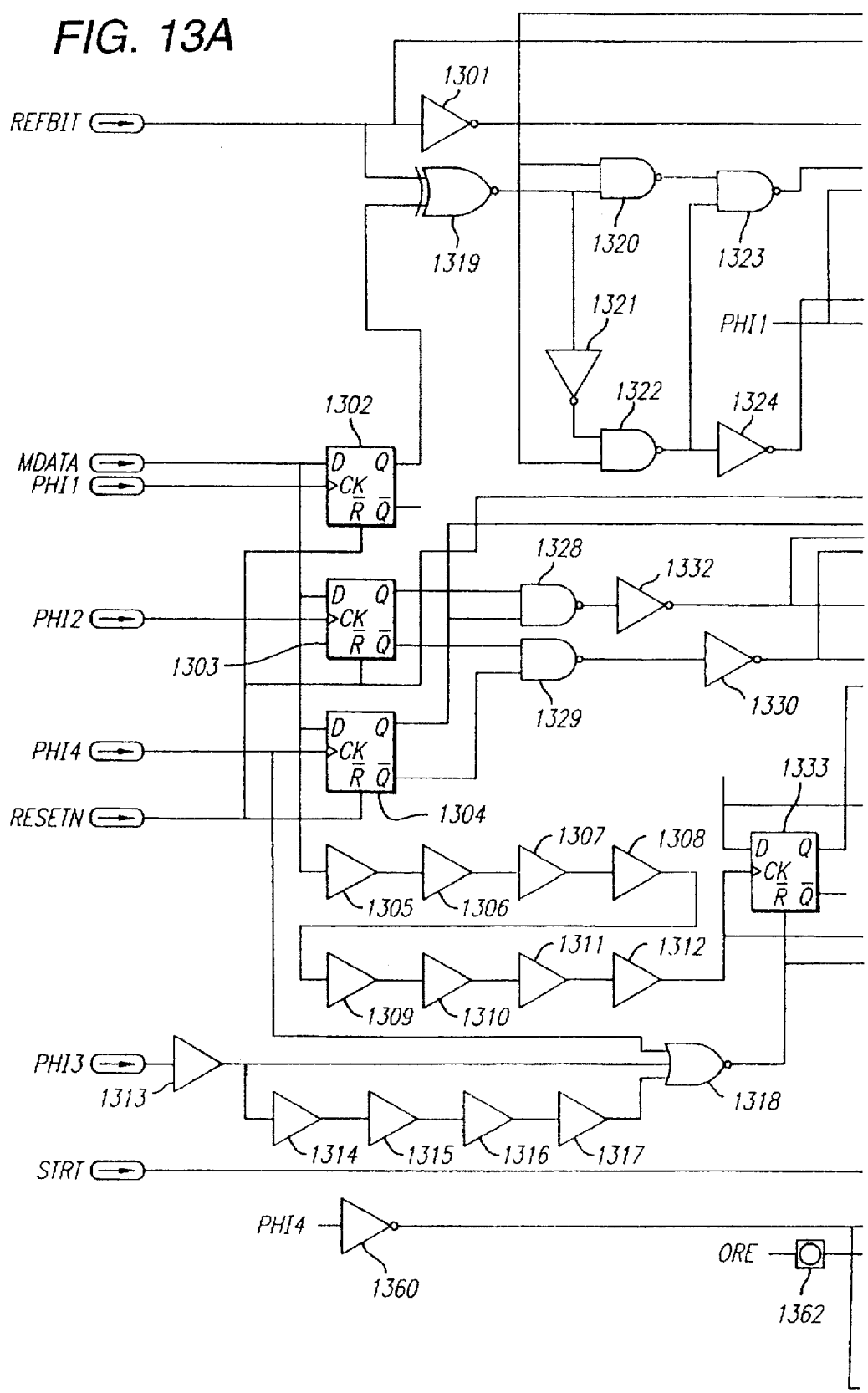
Figure 13B:
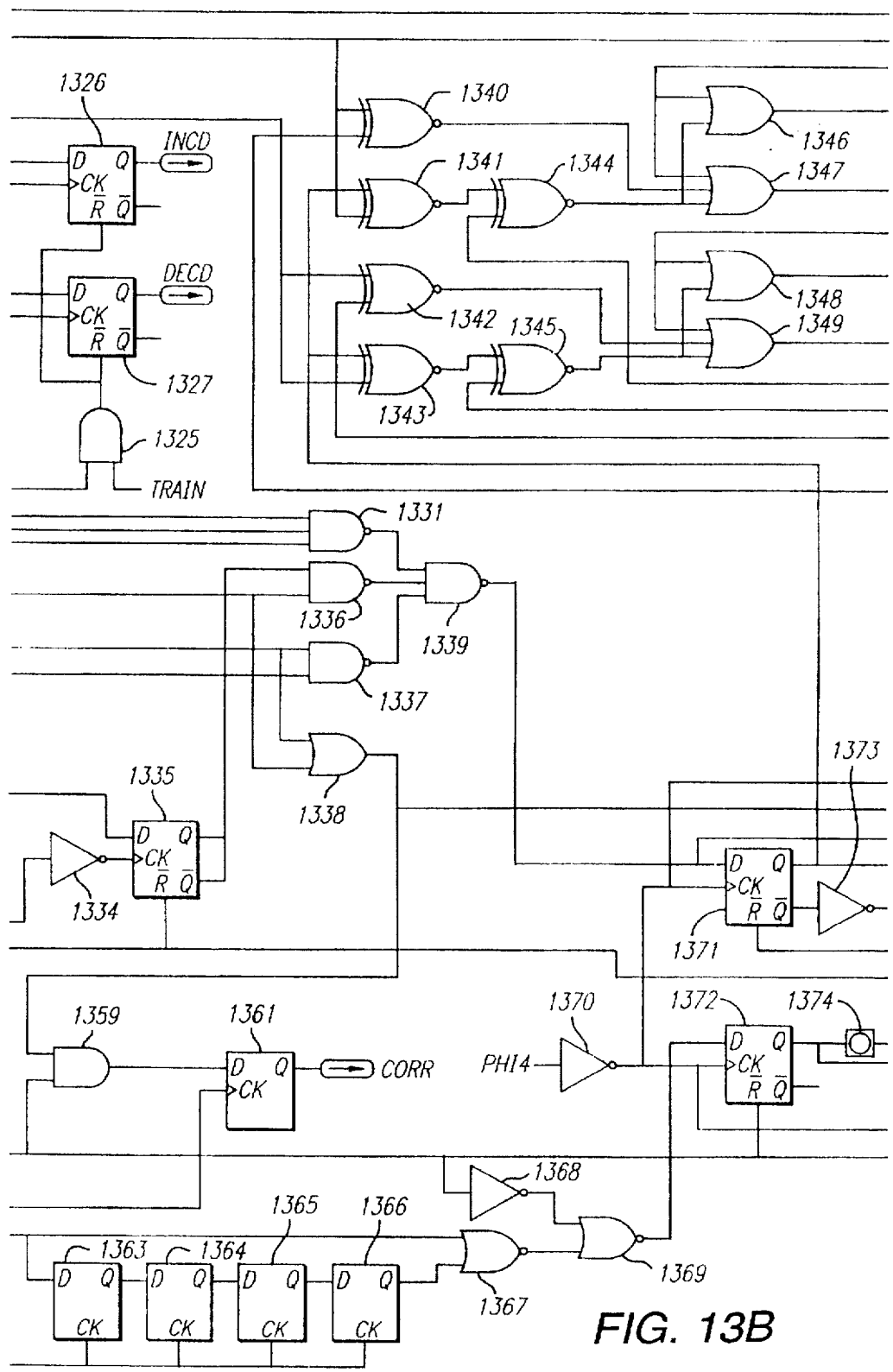
Figure 13C:
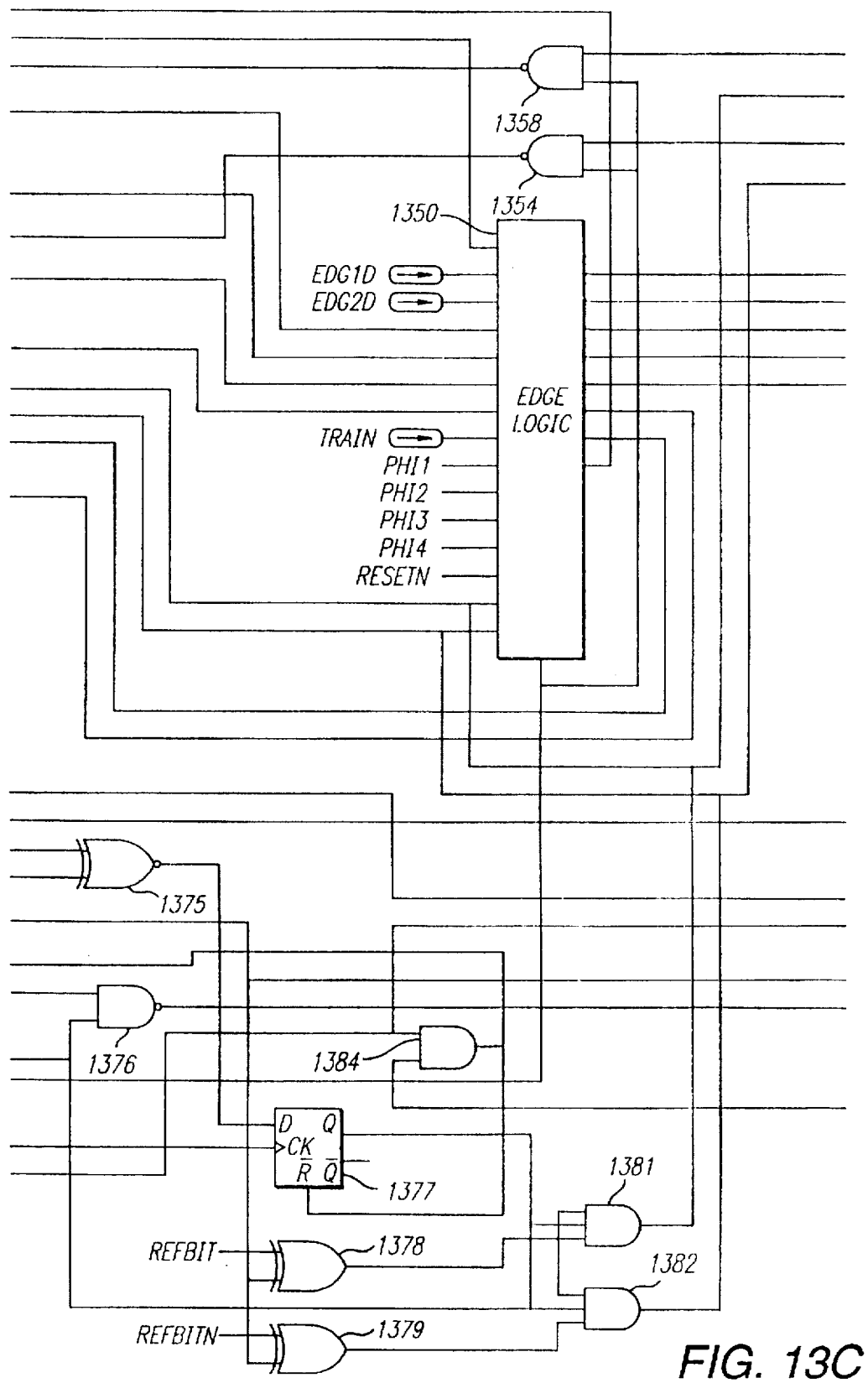
Figure 13D:
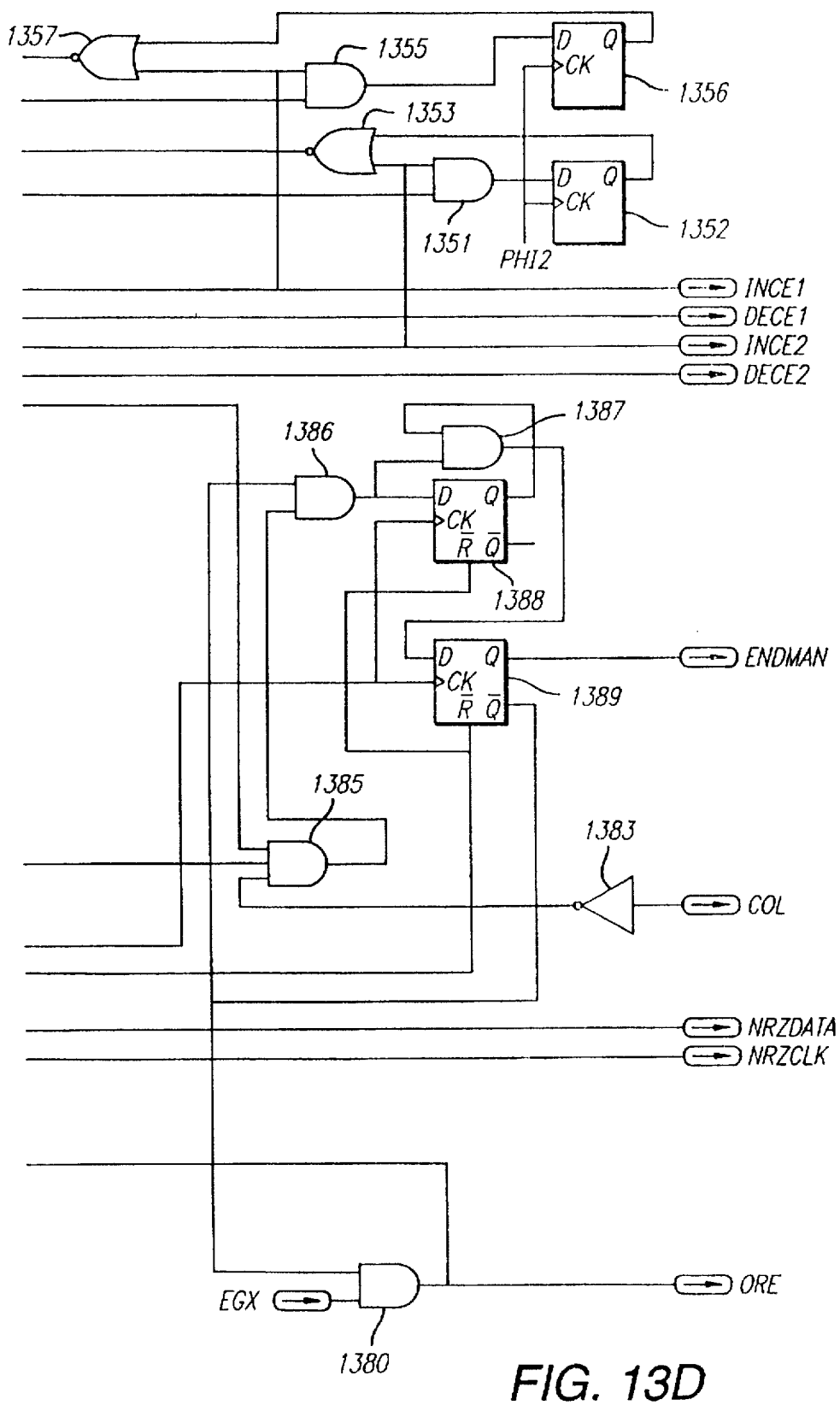

FIG. 12 is a flow diagram illustrating one embodiment of the method of the present invention. The process starts in step 1201. In step 1202, a test is performed to determine if a Manchester coded signal is present. If a Manchester coded signal is present, an indication is made of the presence of a Manchester coded signal in step 1203. In step 1204, the Manchester decoder is activated. In step 1205, delay is introduced in the Manchester coded signal to compensate for jitter and to synchronize the Manchester coded signal with other signals. In step 1206, an address is derived from the Manchester coded signal. In step 1207, a test is performed to determine if the address matches an address qualification. If the address matches, the activation of the Manchester decoder is maintained in step 1209. If, however, there is an address mismatch, the Manchester decoder is deactivated in step 1208. After step 1208 or step 1209, the process ends in step 1210.

Figure 5A:
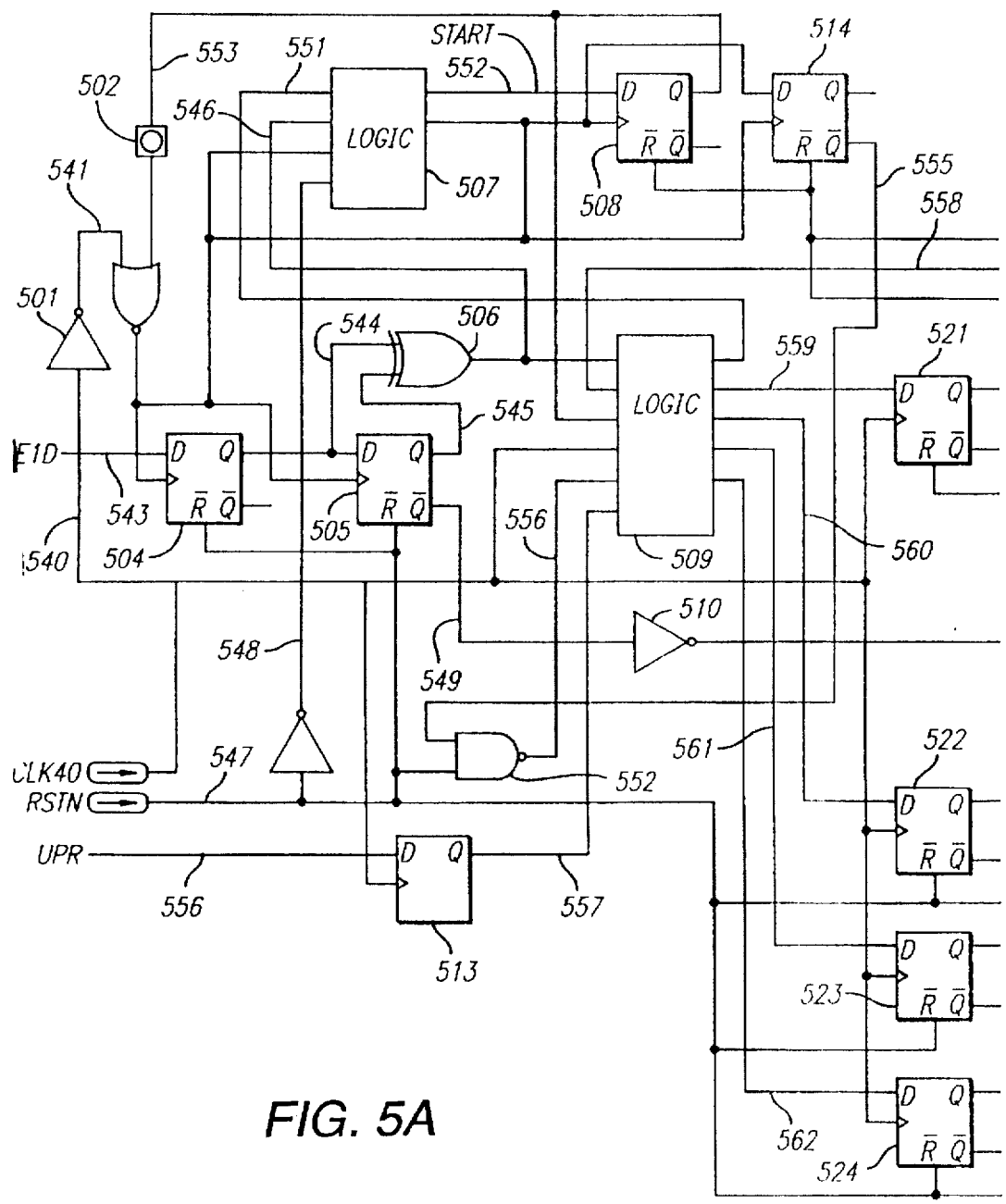
Figure 5B:
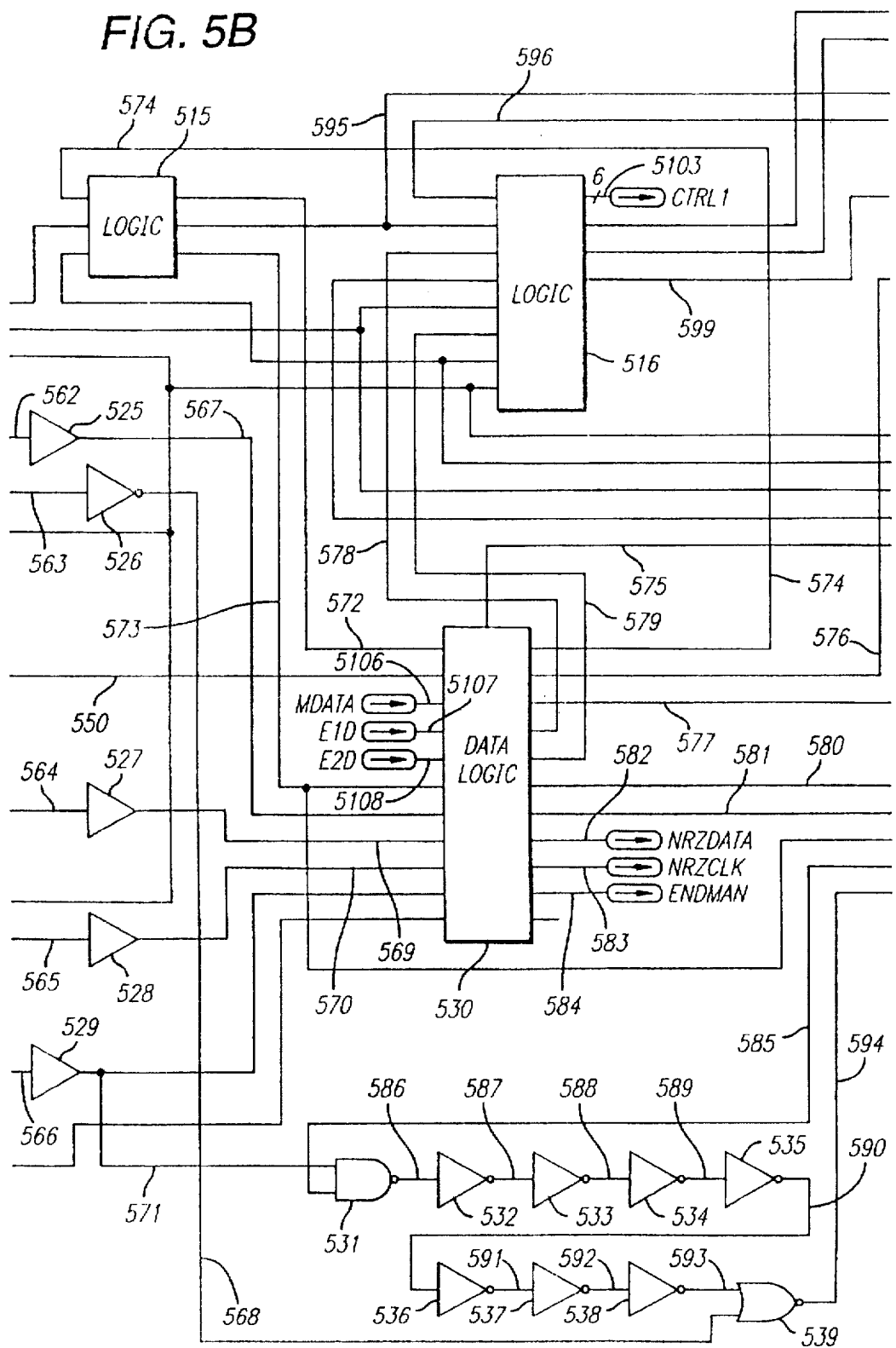
Figure 5C:
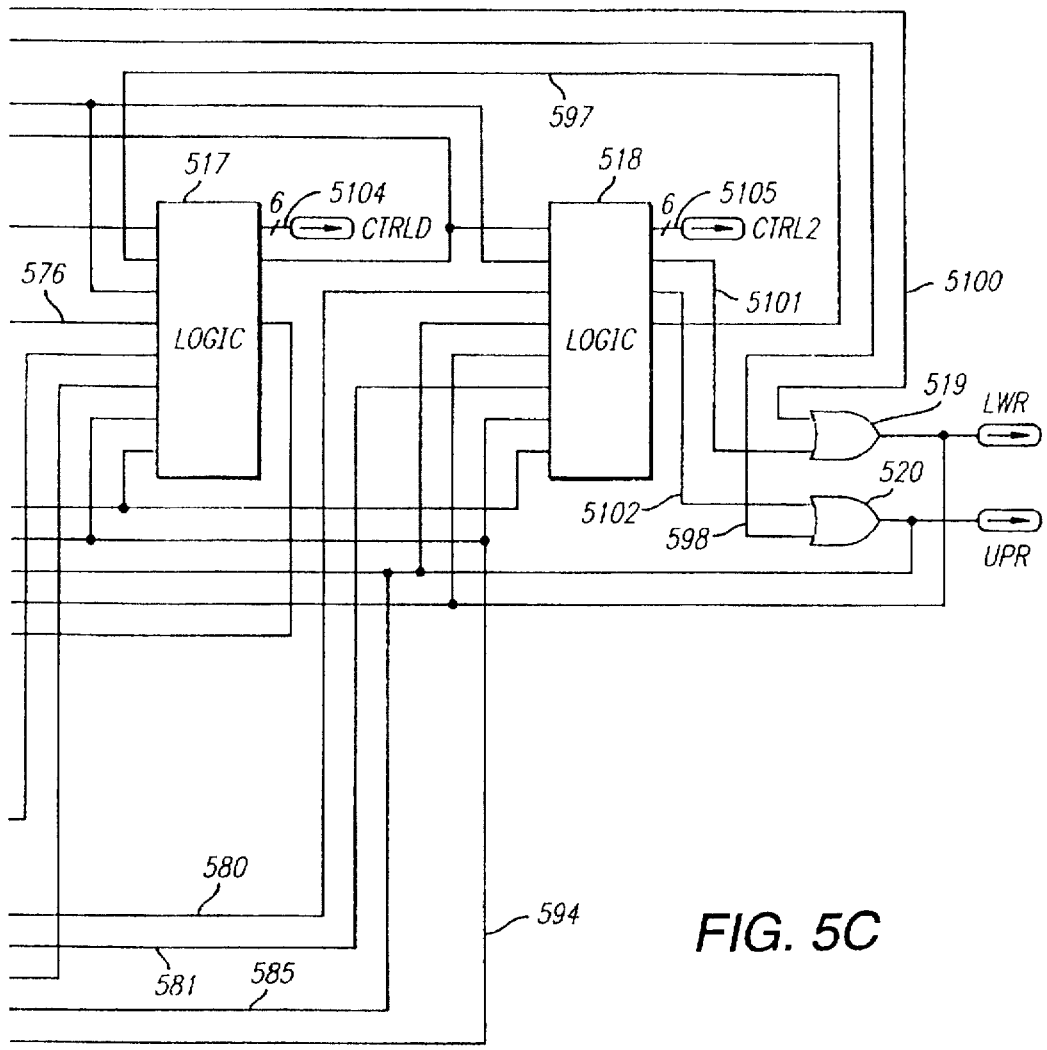

FIGS. 13-1, 13-2, 13-3 and 3-4 are a schematic diagram illustrating an embodiment of data logic block 530 of FIG. 5. Input REFBIT is coupled to an input of inverter 1301, to an input of XNOR gate 1319, to an input of XNOR gate 1340, to an input of XNOR gate 1341, and to edge logic block 1350. Input MDATA is coupled to the D input of D flip-flop 1302, to the D-input of D flip-flop 1303, to the D-input of D flip-flop 1304, and to an input of buffer 1305. Input PHI1 is coupled to the clock input of D flip-flop 1302. Input PHI2 is coupled to the clock input of D flip-flop 1303. Input PHI4 is coupled to the clock input of D flip-flop 1304 and to an input of OR gate 1318. Input RESETN is coupled to the reset input of D flip-flop 1302, to the reset input of D flip-flop 1303, to the reset input of D flip-flop 1304, and to an input of AND gate 1325. Input PHI3 is coupled to an input of buffer 1313. The output of buffer 1313 is coupled to an input of buffer 1314 and to an input of OR gate 1318.

The output of buffer 1314 is coupled to an input of buffer 1315. The output of buffer 1315 is coupled to an input of buffer 1316. The output of buffer 1316 is coupled to an input of buffer 1317. The output of buffer 1317 is coupled to an input of OR gate 1318. The output of OR gate 1318 is coupled to the reset input of D flip-flop 1333, to the reset input of D flip-flop 1335, and to an input of AND gate 1376.

The output of buffer 1305 is coupled to an input of buffer 1306. The output of buffer 1306 is coupled to an input of buffer 1307. The output of buffer 1307 is coupled to an input of buffer 1308. The output of buffer 1308 is coupled to an input of buffer 1309. The output of buffer 1309 is coupled to an input 1310. The output of buffer 1310 is coupled to an input 1311. The output of buffer 1311 is coupled to an input of buffer 1312. The output of buffer 1312 is coupled to the clock input of D flip-flop 1333 and to an input of inverter 1334.

The Q output of D flip-flop 1302 is coupled to an input of XNOR gate 1319. The output of XNOR 1319 is coupled to an input of NAND gate 1320 and to an input of inverter 1321. The output of inverter 1321 is coupled to an input of NAND gate 1322. An output of edge logic block 1350 is coupled to an input of NAND gate 1320 and to an input of NAND gate 1322. The output of NAND gate 1320 is coupled to an input of NAND gate 1323. The output of NAND gate 1322 is coupled to an input of NAND gate 1323 and to an input of inverter 1324. The output of NAND gate 1323 is coupled to the D input of D flip-flop 1326. The output of inverter 1324 is coupled to the D input of D flip-flop 1327. Input PHI1 is coupled to the clock input of D flip-flop 1326 and to the clock input of D flip-flop 1327. Input TRAIN is coupled to an input of AND gate 1325. The output of AND gate 1325 is coupled to the reset input of D flip-flop 1326 and to the reset input of D flip-flop 1327. The Q output of D flip-flop 1326 is coupled output INCD. The Q output of D flip-flop 1327 is coupled to output DECD.

The Q output of D flip-flop 1303 is coupled to an input of NAND gate 1328. The inverted Q output (denoted as $\overline{Q}$) of D flip-flop 1303 is coupled to an input of NAND gate 1329. The Q output of D flip-flop 1304 is coupled to an input of NAND gate 1331 and to an input of NAND gate 1328. The inverted Q output of D flip-flop 1304 is coupled to an input of NAND gate 1329. The output of NAND gate 1328 is coupled to an input of NAND gate 1331 and to an input of inverter 1332. The output of NAND gate 1329 is coupled to an input of NAND gate 1331 and to an input of inverter 1330.

The D inputs of each of D flip-flops 1333 and 1335 are coupled to a positive supply voltage source. The Q output of D flip-flop 1333 is coupled to an input of NAND gate 1337.

The output of inverter 1334 is coupled to the clock input of D flip-flop 1335. The inverted Q output of D flip-flop 1335 is coupled to an input of NAND gate 1336. The output of inverter 1330 is coupled to an input of NAND gate 1337 and to an input of OR gate 1338. The output of inverter 1332 is coupled to an input of NAND gate 1336 and to an input of OR gate 1338. The output of NAND gate 1331 is coupled to an input of NAND gate 1339. The output of NAND gate 1336 is coupled to an input of NAND gate 1339. The output of NAND gate 1337 is coupled to an input of NAND gate 1339.

Input STRT is coupled to an input of AND gate 1359, to the reset input of D flip-flop 1372, to an input of inverter 1368, to an input of AND gate 1384, to the reset input of D flip-flop 1388, and to the reset input of D flip-flop 1389. Input ORE is coupled to a first terminal of delay element 1362. A second terminal of delay element 1362 is coupled to the D input of D flip-flop 1363 and to an input of NOR gate 1367. Input PHI4 is coupled to an input of inverter 1360. The output of inverter 1360 is coupled to the clock input of D flip-flop 1361, to the clock input of D flip-flop 1363, to the clock input of D flip-flop 1364, to the clock input of D flip-flop 1365, and to the clock input of D flip-flop 1366. The Q output of D flip-flop 1363 is coupled to the D input of D flip-flop 1364. The Q output of D flip-flop 1364 is coupled to the D input of D flip-flop 1365. The Q output of D flip-flop 1365 is coupled to the D input of D flip-flop 1366. The Q output of D flip-flop 1366 is coupled to an input of NOR gate 1367. The output of inverter 1368 is coupled to an input of NOR gate 1369. The output of NOR gate 1367 is coupled to an input of NOR gate 1369. The output of NOR gate 1369 is coupled to the D input of D flip-flop 1372.

The output of OR gate 1338 is coupled to an input of AND gate 1359 and to an input of NAND gate 1385. The output of AND gate 1359 is coupled to the D input of D flip-flop 1361. The Q output of D flip-flop 1361 is coupled to output CORR. The output of NAND gate 1339 is coupled to the D input of D flip-flop 1371 and to an input of XNOR gate 1375. Input PHI4 is coupled to an input of inverter 1370. The output of inverter 1370 is coupled to the clock input of D flip-flop 1372, to the clock input of D flip-flop 1377, to the clock input of D flip-flop 1371, to the clock input of D flip-flop 1389, and to the clock input of D flip-flop 1388.

The inverted Q output of D flip-flop 1371 is coupled to an input of inverter 1373. The output of inverter 1373 is coupled to output NRZDATA, to an input of XOR gate 1378 and to an input of XOR gate 1379. The Q output of D flip-flop 1372 is coupled to a first terminal of delay element 1374, to edge logic block 1350, to an input of NAND gate 1354 and to an input of NAND gate 1358. A second terminal of delay element 1374 is coupled to an input of AND gate 1376, to an input of AND gate 1381, and to an input of AND gate 1382. The Q output of D flip-flop 1371 is coupled to an input of XNOR gate 1341, to an input of XNOR gate 1343, and to an input of XNOR gate 1375. The output of XNOR gate 1375 is coupled to the D input of D flip-flop 1377. The output of AND gate 1384 is coupled to the reset input of D flip-flop 1371 and to the reset input of D flip-flop 1377. The Q output of D flip-flop 1377 is coupled to an input of AND gate 1381 and to an input of AND gate 1382. The output of XOR gate 1378 is coupled to an input of AND gate 1381. The output of XOR gate 1379 is coupled to an input of AND gate 1382.

Input TRAIN is coupled to edge logic block 1350. Input EDG1D is coupled to edge logic block 1350. Input EDG2D is coupled to edge logic block 1350. Input PHI1 is coupled to edge logic block 1350. Input PHI2 is coupled to edge logic block 1350. Input PHI3 is coupled to edge logic block 1350. Input PHI4 is coupled to edge logic block 1350. Input RESETN is coupled to edge logic block 1350.

The output of inverter 1301 is coupled to an input of XNOR gate 1342 and to an input of XNOR gate 1343. An output of edge logic unit 1350 is coupled to an input of XNOR gate 1340. An output of edge logic unit 1350 is coupled to an input of XNOR gate 1342.

The output of XNOR gate 1341 is coupled to an input of NOR gate 1344. The output of XNOR gate 1343 is coupled to an input of NOR gate 1345.

Input PHI2 is coupled to the clock input of D flip-flop 1356 and to the clock input of D flip-flop 1352. Edge logic block 1350 is coupled to output INCE1, to an input of NOR gate 1357, and to an input of AND gate 1355. Edge logic block 1350 is coupled to output DECE1. Edge logic block 1350 is coupled to output INCE2, to an input of NOR gate 1353, and to an input of AND gate 1351. Edge logic block 1350 is coupled to output DECE2. The output of AND gate 1381 is coupled to edge logic block 1350, to an input of NOR gate 1344, and to an input of AND gate 1355. The output of AND gate 1382 is coupled to edge logic block 1350, to an input of NOR gate 1345, and to an input of AND gate 1351.

The output of AND gate 1355 is coupled to the D input of D flip-flop 1356. The Q output of D flip-flop 1356 is coupled to an input of NOR gate 1357. The output of NOR gate 1357 is coupled to an input of NAND gate 1358. The output of NAND gate 1358 is coupled to an input of OR gate 1346 and to an input of OR gate 1347.

The output of AND gate 1351 is coupled to the D input of D flip-flop 1352. The Q output of D flip-flop 1352 is coupled to an input of NOR gate 1353. The output of NOR gate 1353 is coupled to an input of NAND gate 1354. The output of NAND gate 1354 is coupled to an input of OR gate 1348 and to an input of OR gate 1349.

An output of XNOR gate 1340 is coupled to an input of OR gate 1347. An output of NOR gate 1344 is coupled to an input of OR gate 1346 and to an input of OR gate 1347. The output of OR gate 1346 is coupled to edge logic block 1350. The output of OR gate 1347 is coupled to edge logic block 1350.

The output of XNOR gate 1342 is coupled to an input of OR gate 1349. The output of NOR gate 1345 is coupled to an input of OR gate 1348 and to an input of OR gate. 1349. The output of OR gate 1348 is coupled to edge logic block 1350. The output of OR gate 1349 is coupled to edge logic block 1350.

Edge logic block 1350 is coupled to an input of NAND gate 1385. Input COL is coupled to an input of inverter 1383. The output of inverter 1383 is coupled to an input of NAND gate 1385. Input EGX is coupled to an input of AND gate 1380. The inverted Q output Of D flip-flop 1389 is coupled to an input of NAND gate 1386 and to an input of AND gate 1380. The output of AND gate 1380 is coupled to output ORE and to an input of AND gate 1384.

The output of NAND gate 1385 is coupled to an input of NAND gate 1386. The output of NAND gate 1386 is coupled to an input of AND gate 1387 and to the D input of D flip-flop 1388. The Q output of D flip-flop 1388 is coupled to an input of AND gate 1387. The output of AND gate 1387 is coupled to the D input of D flip-flop 1389. The Q output of D flip-flop 1389 is coupled to output ENDMAN. The output of AND gate 1376 is coupled to output NRZCLK.

Input REFBIT is coupled to an input of XOR gate 1378. Input REFBITN is coupled to an input of XOR gate 1379.

Data logic block 530 generates NRZCLK signal 583, recovers NRZDATA signal 582 and MDATA signal 5106 from a Manchester-coded data stream, determines the end of a Manchester-coded data packet, and adjusts delay counter circuitry of FIG. 4 to track the Manchester-coded data stream.

Four-phase clock signals PHI1, PHI2, PHI3, and PHI4 are generated by the circuitry illustrated in FIG. 5. Signal PHI1 is present at node 567. Signal PHI2 is present at node 569. Signal PHI3 is present at node 570. Signal PHI4 is present at node 571. D flip flops 1303 and 1304 clock in incoming Manchester data signal MDATA based on clock phase signals PHI2 and PHI4. Valid Manchester data bits change polarity at each bit data boundary. If D flip top 1303, which is clocked by clock phase signal PHI2, clocks in a binary one value and D flip flop 1304, which is clocked by clock phase signal PHI4, clocks in a binary zero value, then the data bit present in signal MDATA is a binary zero value. If D flip flop 1303 clocks in a binary zero value and D flip flop 1304 clocks in a binary one value, then the data bit present in signal MDATA is a binary one value. If D flip flops 1303 and 1304 clock in the same polarity, i.e. both zeros or ones, then either the end of the Manchester data stream has been reached or a clocking error has occurred. To increase the tolerance for clocking errors, present invention provides the ability to recover Manchester data having a jitter of ±18 nanoseconds and a duty cycle offset of clock signal CLK20 at node 209 of ±5 nanoseconds. Clock signal CLK40 is generated by a frequency doubler comprising elements 305, 343 and 306 of FIG. 3. If clock signal CLK20 has a duty cycle other than 50 percent, the duty cycle of clock phase signals PHI1 and PHI3 will be different from that of clock phase signals PHI2 and PHI4.

D flip flops 1333 and 1335 allow recovery from non-Manchester data or mis-clocked data. During the times when clock phase signals PHI3 and PHI4 are active, D flip flops 1333 and 1335 have their resets disabled. A transition of MDATA will, after an appropriate delay, clock the two flip flops and provide the correct bit polarity.

Figure 14A:
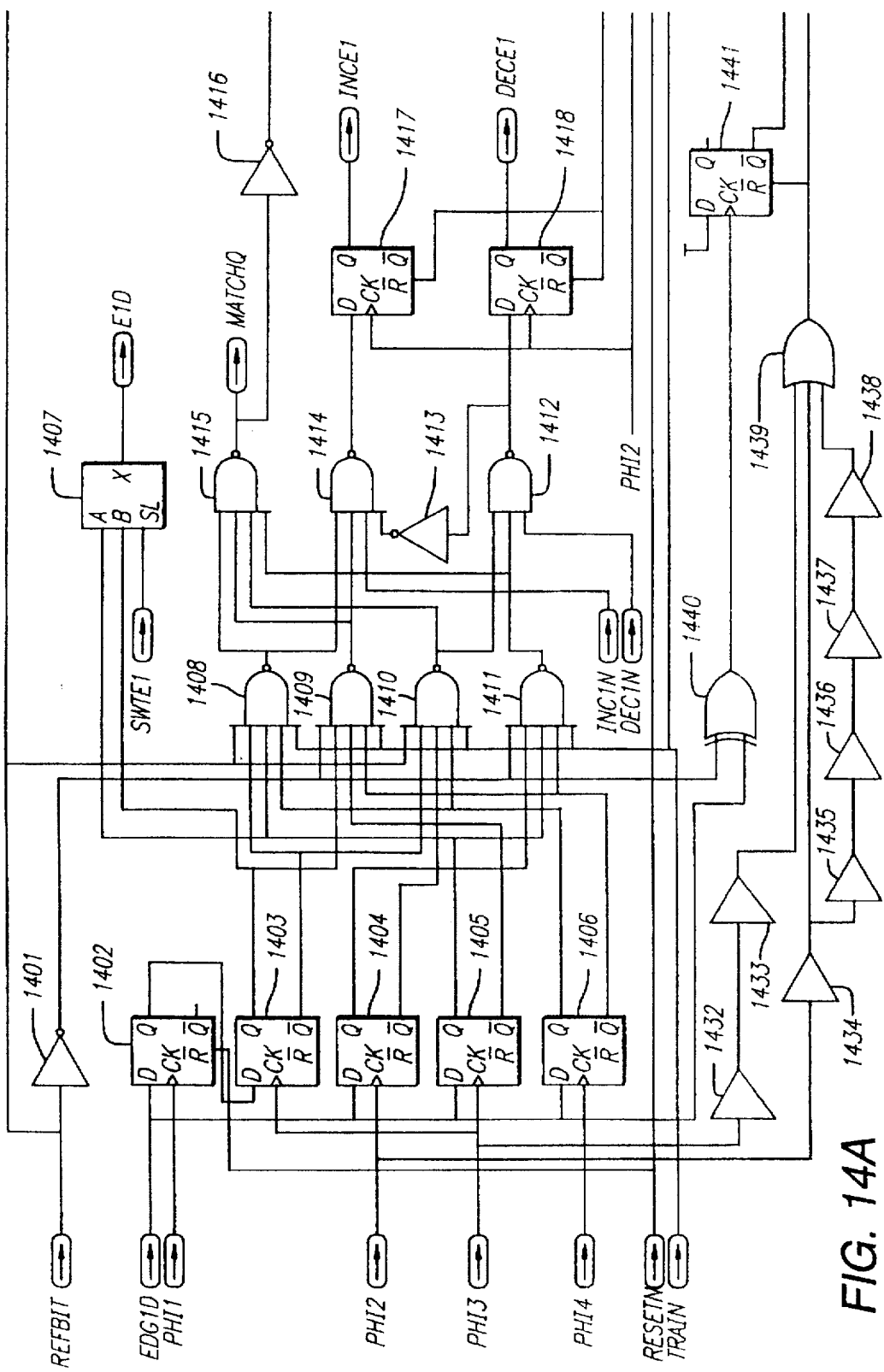
Figure 14B:
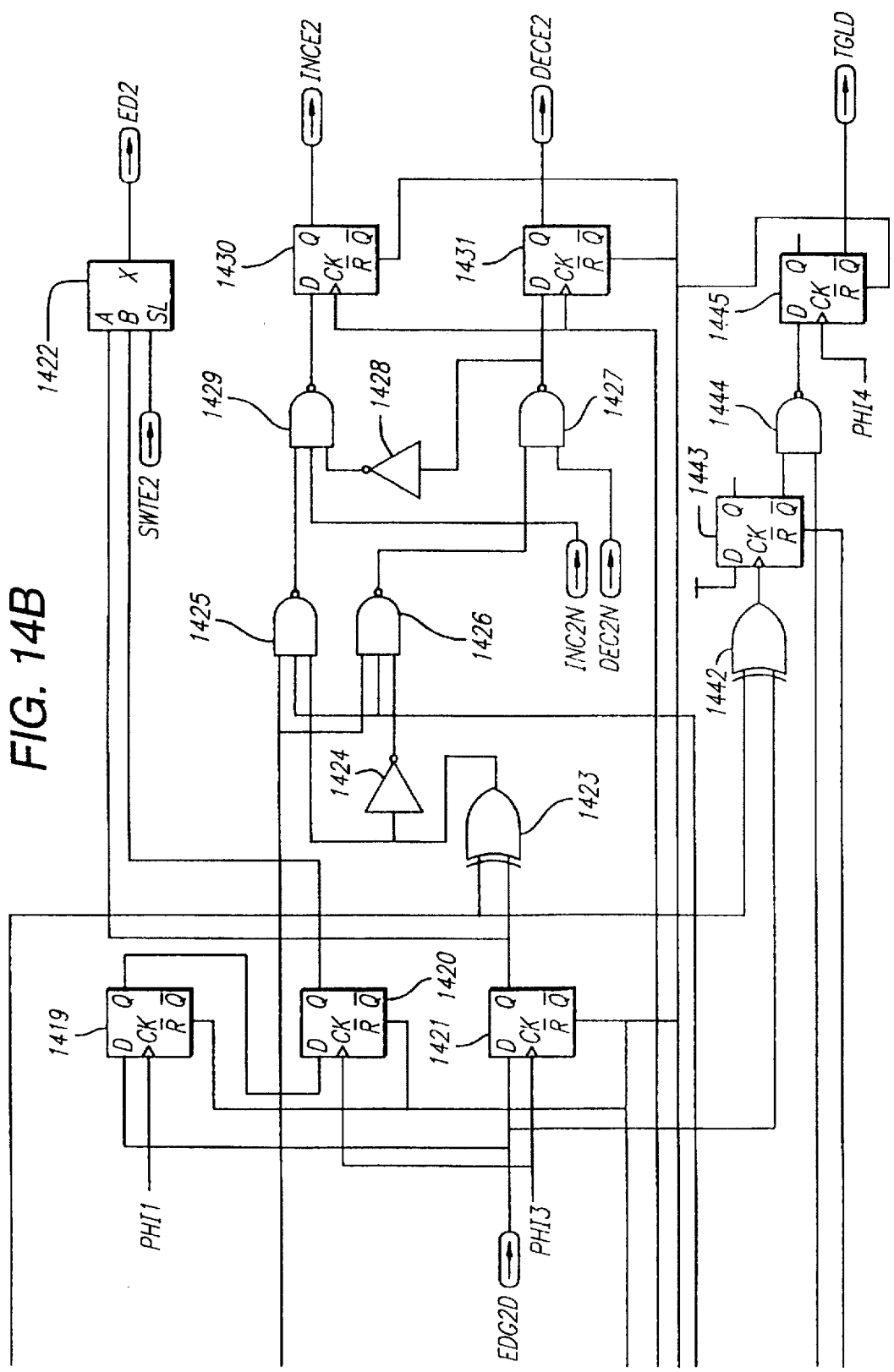

FIGS. 14-1 and 14-2 are a schematic diagram illustrating an embodiment of edge logic block 1350 of FIG. 13. Input REFBIT is coupled to an input of inverter 1401, an input of NAND gate 1408, an input of NAND gate 1410, an input of XOR gate 1423, and an input of XOR gate 1442. The output of inverter 1401 is coupled to an input of NAND gate 1409, an input of NAND gate 1411 and an input of XOR gate 1440. Input EDG1D is coupled to the D input of D flip-flop 1402, to the D input of D flip-flop 1404, to the D input of D flip-flop 1405, to the D input of D flip-flop 1406, and to an input of XOR 1440. Input PHI1 is coupled to the clock input of D flip-flop 1402. Input PHI2 is coupled to the clock input of D flip-flop 1404 and to an input of buffer 1434. Input PHI3 is coupled to the clock input of D flip-flop 1403, to the clock input of D flip-flop 1405, and to an input of buffer 1432. Input PHI4 is coupled to the clock input of D flip-flop 1406. Input RESETN is coupled to the reset input of each of D flip-flops 1402, 1403, 1404, 1405, 1406, 1417, 1418, 1419; 1420, 1421, 1430, 1431 and 1445. Input TRAIN is coupled to an input of NAND gate 1408, to an input of NAND gate 1409, to an input of NAND gate 1410, to an input of NAND gate 1411, to an input of NAND gate 1425, and to an input of NAND gate 1426.

The Q output of D flip-flop 1402 is coupled to the D input of D flip-flop 1403. The Q output of D flip-flop 1403 is coupled to the B input of multiplexer 1407 and to an input of NAND gate 1409. The Q output of D flip-flop 1404 is coupled to an input of NAND gate 1411. The inverted Q output of D flip-flop 1403 is coupled to an input of NAND gate 1408 and to an input of NAND gate 1410. The inverted Q output of D flip-flop 1404 is coupled to an input of NAND gate 1410. The Q output of D flip-flop of 1405 is coupled to the A input of multiplexer 1407, to an input of NAND gate 1408, and to an input of NAND gate 1411. The inverted Q output of D flip-flop 1405 is coupled to an input of NAND gate 1409 and to an input of NAND gate 1410. The Q output of D flip-flop 1406 is coupled to an input of NAND gate 1408 and to an input of NAND gate 1410. The inverted Q output of D flip-flop 1406 is coupled to an input of NAND gate 1409 and to an input of NAND gate 1411.

Input SWTE1 is coupled to an SL input of multiplexer 1407. Output X of multiplexer 1407 is coupled to output E1D.

Input INC1N is coupled to an input of NAND gate 1414. Input DEC1N is coupled to an input of NAND gate 1412. The output of NAND gate 1408 is coupled to an input of NAND gate 1415 and to an input of NAND gate 1414. The output of NAND gate 1409 is coupled to an input of NAND gate 1415 and to an input of NAND gate 1414. The output of NAND gate 1410 is coupled to an input of NAND gate 1415 and to an input of NAND gate 1412. The output of NAND gate 1411 is coupled to an input of NAND gate 1415 and to an input of NAND gate 1412. The output of NAND gate 1412 is coupled to the input of inverter 1413 and to the D input of D flip-flop 1418. The output of inverter 1413 is coupled to an input of NAND gate 1414. The output of NAND gate 1415 is coupled to output MATCHQ and to an input of inverter 1416. The output of inverter 1416 is coupled to an input of NAND gate 1425 and to an input of NAND gate 1426. The output of NAND gate 1414 is coupled to the D input of D flip-flop 1417.

Input PHI2 is coupled to the clock input of each of D flip-flops 1417, 1418, 1430, and 1431. The Q output of D flip-flop 1417 is coupled to output INCE1. The Q output of D flip-flop 1418 is coupled to output DECE1.

Input EDG2D is coupled to the D input of D flip-flop 1419, to the D input of D flip-flop 1421, and to an input of XOR gate 1442. Input PHI1 is coupled to the clock input of D flip-flop 1419. Input PHI3 is coupled to the clock input of each of D flip-flops 1420 and 1421. The Q output of D flip-flop 1419 is coupled to the D input of D flip-flop 1420. The Q output of D flip-flop 1420 is coupled to the B input of multiplexer 1422. The Q output of D flip-flop 1421 is coupled to the A input of multiplexer 1422 and to an input of XOR gate 1423.

The output of XOR gate 1423 is coupled to an input of NAND gate 1425 and to an input of inverter 1424. The output of inverter 1424 is coupled to an input of NAND gate 1426. The output of NAND gate 1425 is coupled to an input of NAND gate 1429. The output of NAND gate 1426 is coupled to an input of NAND gate 1427. Input INC2N is coupled to an input of NAND gate 1429. Input DEC2N is coupled to an input of NAND gate 1427. The output of NAND gate 1427 is coupled to an input of inverter 1428 and to the D input of D flip-flop 1431. The output of inverter 1428 is coupled to an input of NAND gate 1429. The output of NAND gate 1429 is coupled to the D input of D flip-flop 1430. The Q output of D flip-flop 1430 is coupled to output INCE2. The Q output of D flip-flop 1431 is coupled to output DECE2.

Input SWTE2 is coupled to input SL of multiplexer 1422. Output X of multiplexer of 1422 is coupled to output E2D.

The output of buffer 1432 is coupled to an input of buffer 1433. The output of buffer 1433 is coupled to an input of OR gate 1439. The output of buffer 1434 is coupled to an input of OR gate 1439 and to an input of buffer 1435. The output of buffer 1435 is coupled to an input of buffer 1436. The output of buffer 1436 is coupled to an input of buffer 1437. The output of buffer 1437 is coupled to an input of buffer 1438. The output of buffer 1438 is coupled to an input of OR gate 1439. The output of OR gate 1439 is coupled to the reset input of each of D flip-flops 1441 and 1443. The D input of D flip-flop 1441 is coupled to a positive supply voltage source. The D input of D flip-flop 1443 is coupled to a positive supply voltage source. The output of XOR gate 1440 is coupled to the clock input of D flip-flop 1441. The output of XOR gate 1442 is coupled to the clock input of D flip-flop 1443. The inverted Q output of D flip-flop 1441 is coupled to an input of NAND gate 1444. The inverted Q output of D flip-flop 1443 is coupled to an input of NAND gate 1444. The output of NAND gate 1444 is coupled to the D input of D flip-flop 1445. Input PHI4 is coupled to the clock input of D flip-flop 1445. The inverted Q output of D flip-flop 1445 is coupled to output TGLD.

In the edge logic circuit of FIG. 14, the "0" bit edge (high to low transition) and the "1" bit edge (low to high transition) are constantly tracked at every Manchester data bit. The transitions for the bit cell are constantly adjusted to the PHI3 clock. If no transitions are detected during the PHI2 and PHI4 clock phases, the TGLD bit is set high to indicate the end of the Manchester data stream and ENDMAN (220) is asserted high.

Figure 15:
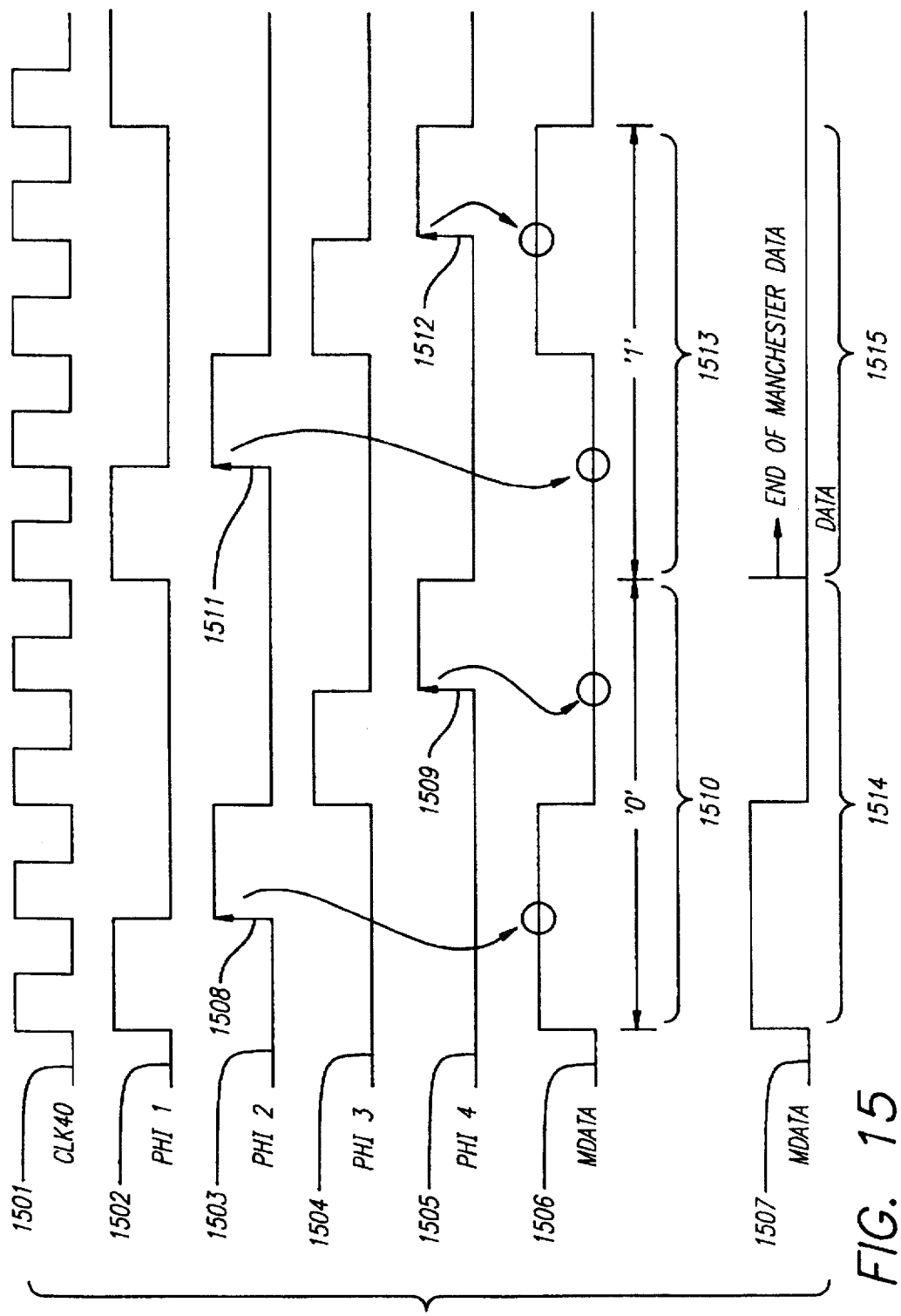
FIG. 15 is a timing diagram illustrating the signals CLK40, PHI1, PHI2, PHI3, PHI4, an example of signal MDATA representing a binary zero and a binary one, and an example of the signal MDATA at the end of a Manchester data stream.

FIG. 15 is a timing diagram illustrating the signals CLK40, PHI1, PHI2, PHI3, PHI4, an example of signal MDATA representing a binary zero and a binary one, and an example of the signal MDATA at the end of a Manchester data stream. Signal CLK40 is illustrated by waveform 1501. Signal CLK40 is a squarewave signal preferably having a 50% duty cycle.

Signals PHI1, PHI2, PHI3, and PHI4 are illustrated by waveforms 1502, 1503, 1504, and 1505, respectively. Signal PHI1 is a first phase clock signal has a high logic level for a duration equal to the period of the signal CLK40. Signal PHI2 is a second phase clock signal that transitions from a low logic level to a high logic level as signal PHI1 is transitioning from a high logic level to a low logic level and remains at a high logic level for a duration equal to the period of signal CLK40. Signal PHI3 is a third phase clock signal that transitions from a low logic level to a high logic level as signal PHI2 is transitioning from a high logic level to a low logic level and remains at a high logic level for a duration equal to the period of signal CLK40. Signal PHI4 is a fourth phase clock signal that transitions from a low logic level to a high logic level as signal PHI3 is transitioning from a high logic level to a low logic level and remains at a high logic level for a duration equal to the period of CLK40.

Signals PHI1, PHI2, PHI3, and PHI4 each have a period equal to four times the period of signal CLK40. Since each of signals PHI1, PHI2, PHI3, and PHI4 remains at high logic level for a duration equal to one period of signal CLK40 and exactly one of signals PHI1, PHI2, PFI3, and PHI4 is at a high logic level at any given time, signal PHI1 transitions from a low logic level to a high logic level as signal PHI4 is transitioning from a high logic level to a low logic level.

Waveform 1506 illustrates an example of signal MDATA representing a binary zero and a binary one. Signal MDATA is sampled at the rising edge of clock phase signal PHI2 at transition 1508 and, in this example, is found to be at a high logic level. Signal MDATA is also sampled at the rising edge of clock signal PHI4 at transition 1509, where, in this example, it is found to be at a low logic level. Since signal MDATA is high at transition 1508 and low transition 1509, signal MDATA is found to represent a binary zero during time period 1510.

Signal MDATA is again sampled at the rising edge of clock phase signal PHI2 at transition 1511, and is found to be at a low logic level in this example. Signal MDATA is also sampled at the rising edge of clock phase signal PHI4 at transition 1512, where it is found to be at a high logic level in this example. Since signal MDATA is low at transition 1511 and high at transition 1512, signal MDATA is found to represent a binary one during time period 1513.

Waveform 1507 illustrates an example of signal MDATA at the end of a Manchester data stream. If waveform 1507 is sampled at PHI2 transition 1508 and PHI4 transition 1509 during time period 1504, signal MDATA found to have a high logic level and a low logic level, respectively, and thus is found to represent a logic zero.

If waveform 1507 is sampled at PHI2 transition 1511, it is found to have a low logic level. If waveform 1507 is sampled at PHI4 transition 1512, it is found to have a low logic level. Since waveform 1507 is found to have a low logic level at both PHI2 transition 1511 and PHI4 transition 1512, it is clear that signal MDATA does not represent valid Manchester data during time period 1515. Thus, it is determined that the end of a Manchester data stream has been reached and the signal ENDMAN is asserted high.

A condition where MDATA has the same logic level (either low or high) at both the rising edge of clock phase signal PHI2 and the rising edge of clock phase signal PHI4 could also exist if a clocking error occurs, but the present invention provides increased immunity to clocking errors by increasing the tolerance for jitter in the incoming Manchester coded data.

Thus, a method and apparatus for recovering clock and data from a Manchester coded signal with a power saving mode and enhanced jitter handling capability has been provided.

We claim:

1. A method for decoding a Manchester coded signal comprising the steps of:
   tracking jitter in said Manchester coded signal;
   introducing an adjustable delay in said Manchester coded signal;
   adjusting said adjustable delay to synchronize said Manchester coded signal with a clock signal.

2. The method of claim 1 further comprising the steps of:
   detecting a presence of said Manchester coded signal;
   entering a powerup mode upon said presence;
   detecting an absence of said Manchester coded signal;
   entering a powerdown mode upon said absence.

3. The method of claim 1 further comprising the steps of:
   detecting a presence of said Manchester coded signal;
   entering a powerup mode upon said presence;
   comparing a destination address recovered from said Manchester coded signal to a pre-defined address qualification;
   detecting a mismatch between said destination address and said predefined address qualification;
   entering a powerdown mode after said mismatch is detected.

4. The method of claim 1 wherein said step of tracking jitter in said Manchester coded signal further comprises the steps of:
   tracking positive-going transitions;
   tracking negative-going transitions;
   tracking an average of said positive-going transitions and said negative-going transitions.

5. The method of claim 1 wherein said step of introducing said delay in said Manchester coded signal to synchronize said Manchester coded signal with said clock signal further comprises the steps adjusting a phase of said clock signal so as to provide phase slip correction.

6. A circuit for decoding a Manchester coded signal comprising:

a logic block for detecting jitter in said Manchester coded signal;

a delay unit block for introducing an adjustable delay in said Manchester coded signal;

said logic block further comprising a four phase clock for providing adjustment of said adjustable delay relative to a clock signal of said four phase clock.

7. The circuit of claim 6 further comprising:

a mode control block for disabling a Manchester decoder clock signal in an absence of said Manchester coded signal.

8. The circuit of claim 6 wherein said delay unit block comprises:

a first counter for tracking positive-going transitions;

a second counter for tracking negative-going transitions;

a third counter for counting an average of said positive-going transitions and said negative-going transitions.

9. The circuit of claim 6 wherein said jitter may exceed ±18 nanoseconds.

10. A method for recovery Manchester coded signals comprising the steps of:

indicating a presence of an incoming Manchester coded signal;

activating a Manchester decoder in response to said presence;

introducing delay in said Manchester coded signal;

deriving an address from said Manchester coded signal;

comparing an address derived from said Manchester coded signal to an address qualification;

controlling activity of said Manchester decoder in response to said step of comparing.

11. The method of claim 10 wherein step of controlling activity comprises the steps of:

deactivating said Manchester decoder if said address does not match said address qualification;

maintaining activation of said Manchester decoder if said address matches said address qualification.

12. The method of claim 10 wherein said step of introducing delay comprises the steps of:

providing a first signal representative of a delay related to rising edge transitions of said Manchester coded signal;

providing a second signal representative of a delay related to failing edge transitions of said Manchester coded signal;

providing a third signal representative of a delay related to an average of said first signal and said second signal.

13. A system comprising:

a physical layer transceiver coupled to a transmission medium for receiving a Manchester coded signal from said transmission medium;

a Manchester decoder coupled to said physical layer transceiver for recovering a clock signal and a data signal from said Manchester coded signal, said Manchester decoder comprising a delay unit block and a logic block, said delay unit block for introducing an adjustable delay in said Manchester coded signal relative to a clock signal and said logic block for adjusting said adjustable delay to synchronize said Manchester coded signal with said clock signal;

a data link controller for monitoring said data signal for an address, for comparing said address to an address qualification to produce an outcome, and for controlling said Manchester decoder based on said outcome.

14. The system of claim 13 wherein said Manchester decoder further comprises:

a first output for providing a first signal representative of a first delay, said first delay dependent upon rising edge occurrences;

a second output for providing a second signal representative of a second delay, said second delay dependent upon falling edge occurrences;

a third output for providing a third signal representative of a third delay, said third delay dependent upon an average of said rising edge occurrences and said falling edge occurrences.

15. The system of claim 14 wherein said data link controller deactivates said Manchester decoder if said outcome indicates a mismatch between said address and said address qualification.

16. The system of claim 15 wherein said data link controller deactivates said Manchester decoder by disabling an internal clock signal.

17. The system of claim 16 wherein said Manchester decoder further comprises a buffer for receiving said data signal and for transmitting said data signal at a regular clock rate.

18. A method for decoding a Manchester coded signal comprising the steps of:

tracking jitter in said Manchester coded signal;

introducing a delay in said Manchester coded signal to synchronize said Manchester coded signal with a clock signal;

detecting a presence of said Manchester coded signal;

entering a powerup mode upon said presence;

detecting an absence of said Manchester coded signal;

entering a powerdown mode upon said absence.

19. A method for decoding a Manchester coded signal comprising the steps of:

tracking jitter in said Manchester coded signal;

introducing a delay in said Manchester coded signal to synchronize said Manchester coded signal with a clock signal;

detecting a presence of said Manchester coded signal;

entering a powerup mode upon said presence;

comparing a destination address recovered from said Manchester coded signal to a pre-defined address qualification;

detecting a mismatch between said destination address and said predefined address qualification;

entering a powerdown mode after said mismatch is detected.

20. A method for decoding a Manchester coded signal comprising the steps of:

tracking jitter in said Manchester coded signal;

introducing a delay in said Manchester coded signal to synchronize said Manchester coded signal with a clock signal;

detecting a presence of said Manchester coded signal;

entering a powerup mode upon said presence.

* * * * *